(12) United States Patent
Das et al.

(10) Patent No.: US 10,043,795 B2
(45) Date of Patent: *Aug. 7, 2018

(54) HIGH CURRENT, LOW SWITCHING LOSS SIC POWER MODULE

(71) Applicant: Cree, Inc., Durham, NC (US)

(72) Inventors: Mrinal K. Das, Morrisville, NC (US); Henry Lin, Chapel Hill, NC (US); Marcelo Schupbach, Raleigh, NC (US); John Williams Palmour, Cary, NC (US)

(73) Assignee: Cree, Inc., Durham, NC (US)

( * ) Notice: Subject to any disclaimer, the term of this patent is extended or adjusted under 35 U.S.C. 154(b) by 36 days.

This patent is subject to a terminal disclaimer.

(21) Appl. No.: 15/077,329

(22) Filed: Mar. 22, 2016

(65) Prior Publication Data

US 2016/0204101 A1 Jul. 14, 2016

Related U.S. Application Data

(63) Continuation of application No. 14/277,820, filed on May 15, 2014, now Pat. No. 9,373,617, which is a
(Continued)

(51) Int. Cl.
*H01L 27/06* (2006.01)
*H01L 21/04* (2006.01)
(Continued)

(52) U.S. Cl.
CPC ........ *H01L 27/0629* (2013.01); *H01L 21/046* (2013.01); *H01L 21/049* (2013.01);
(Continued)

(58) Field of Classification Search
None
See application file for complete search history.

(56) References Cited

U.S. PATENT DOCUMENTS 3,439,189 A 4/1969 Petry
3,629,011 A 12/1971 Tohi et al.
(Continued)

FOREIGN PATENT DOCUMENTS

DE 3942640 A1 8/1990
DE 19809554 A1 9/1998
(Continued)

OTHER PUBLICATIONS

U.S. Appl. No. 13/588,329, filed Aug. 17, 2012.
(Continued)

*Primary Examiner* — Bilkis Jahan
(74) *Attorney, Agent, or Firm* — Anthony J. Josephson

(57) ABSTRACT

A power module includes a housing with an interior chamber and multiple switch modules mounted within the interior chamber of the housing. The switch modules are interconnected and configured to facilitate switching power to a load. Each one of the switch modules includes at least one transistor and at least one diode. The at least one transistor and the at least one diode may be formed from a wide band-gap material system, such as silicon carbide (SiC), thereby allowing the power module to operate at high frequencies with lower switching losses when compared to conventional power modules.

20 Claims, 9 Drawing Sheets

Related U.S. Application Data continuation-in-part of application No. 13/893,998, filed on May 14, 2013, now Pat. No. 9,640,617, which is a continuation-in-part of application No. 13/588,329, filed on Aug. 17, 2012, now Pat. No. 9,673,283.

(60) Provisional application No. 61/533,254, filed on Sep. 11, 2011.

(51) Int. Cl.

| | |
|---|---|
| *H01L 25/07* | (2006.01) |
| *H01L 25/18* | (2006.01) |
| *H01L 29/78* | (2006.01) |
| *H01L 29/16* | (2006.01) |
| *H05K 7/14* | (2006.01) |
| *H01L 29/66* | (2006.01) |
| *H01L 23/00* | (2006.01) |
| *H02M 7/00* | (2006.01) |
| *H02M 7/5387* | (2007.01) |
| *H01L 29/739* | (2006.01) |
| *H01L 29/872* | (2006.01) |
| *H02P 7/03* | (2016.01) |

(52) U.S. Cl.
CPC ............ *H01L 25/072* (2013.01); *H01L 25/18* (2013.01); *H01L 29/1608* (2013.01); *H01L 29/7802* (2013.01); *H05K 7/1432* (2013.01); H01L 24/48 (2013.01); H01L 24/49 (2013.01); H01L 29/66068 (2013.01); H01L 29/7393 (2013.01); H01L 29/872 (2013.01); H01L 2224/0603 (2013.01); H01L 2224/48137 (2013.01); H01L 2224/48139 (2013.01); H01L 2224/48227 (2013.01); H01L 2224/49111 (2013.01); H01L 2224/49113 (2013.01); H01L 2224/49175 (2013.01); H01L 2224/49431 (2013.01); H01L 2224/49433 (2013.01); H01L 2924/00014 (2013.01); H01L 2924/1033 (2013.01); H01L 2924/10272 (2013.01); H01L 2924/12032 (2013.01); H01L 2924/1301 (2013.01); H01L 2924/1305 (2013.01); H01L 2924/1306 (2013.01); H01L 2924/13055 (2013.01); H01L 2924/13062 (2013.01); H01L 2924/13064 (2013.01); H01L 2924/13091 (2013.01); H01L 2924/15153 (2013.01); H01L 2924/19105 (2013.01); H01L 2924/19107 (2013.01); H01L 2924/30107 (2013.01); H02M 7/003 (2013.01); H02M 7/5387 (2013.01); H02P 7/04 (2016.02); Y02B 70/1483 (2013.01)

(56) References Cited

U.S. PATENT DOCUMENTS

| | | |
|---|---|---|
| 3,924,024 A | 12/1975 | Naber et al. |
| 4,160,920 A | 7/1979 | Courier de Mere |
| 4,242,690 A | 12/1980 | Temple |
| 4,466,172 A | 8/1984 | Batra |
| 4,581,542 A | 4/1986 | Steigerald |
| 4,644,637 A | 2/1987 | Temple |
| 4,811,065 A | 3/1989 | Cogan |
| 4,875,083 A | 10/1989 | Palmour |
| 4,927,772 A | 5/1990 | Arthur et al. |
| 4,945,394 A | 7/1990 | Palmour et al. |
| 4,946,547 A | 8/1990 | Palmour et al. |
| 5,005,462 A | 4/1991 | Jasper, Jr. et al. |
| 5,011,549 A | 4/1991 | Kong et al. |
| 5,028,977 A | 7/1991 | Kenneth et al. |
| 5,032,888 A | 7/1991 | Seki |
| 5,111,253 A | 5/1992 | Korman et al. |
| 5,155,289 A | 10/1992 | Bowles |
| 5,168,139 A | 12/1992 | Bettge et al. |
| 5,170,231 A | 12/1992 | Fujii et al. |
| 5,170,455 A | 12/1992 | Goossen et al. |
| 5,184,199 A | 2/1993 | Fujii et al. |
| 5,192,987 A | 3/1993 | Khan et al. |
| 5,200,022 A | 4/1993 | Kong et al. |
| 5,210,051 A | 5/1993 | Carter, Jr. |
| 5,270,554 A | 12/1993 | Palmour |
| 5,292,501 A | 3/1994 | Degenhardt et al. |
| 5,296,395 A | 3/1994 | Khan et al. |
| 5,348,895 A | 9/1994 | Smayling et al. |
| 5,371,383 A | 12/1994 | Miyata et al. |
| 5,384,270 A | 1/1995 | Ueno et al. |
| 5,385,855 A | 1/1995 | Brown et al. |
| RE34,861 E | 2/1995 | Davis et al. |
| 5,393,993 A | 2/1995 | Edmond et al. |
| 5,393,999 A | 2/1995 | Malhi |
| 5,396,085 A | 3/1995 | Baliga |
| 5,459,107 A | 10/1995 | Palmour |
| 5,468,654 A | 11/1995 | Harada |
| 5,479,316 A | 12/1995 | Smrtic et al. |
| 5,488,236 A | 1/1996 | Baliga et al. |
| 5,506,421 A | 4/1996 | Palmour |
| 5,510,281 A | 4/1996 | Ghezzo et al. |
| 5,510,630 A | 4/1996 | Agarwal et al. |
| 5,523,589 A | 6/1996 | Edmond et al. |
| 5,539,217 A | 7/1996 | Edmond et al. |
| 5,545,905 A | 8/1996 | Muraoka et al. |
| 5,587,870 A | 12/1996 | Anderson et al. |
| 5,629,531 A | 5/1997 | Palmour |
| 5,710,059 A | 1/1998 | Rottner |
| 5,726,463 A | 3/1998 | Brown et al. |
| 5,726,469 A | 3/1998 | Chen |
| 5,734,180 A | 3/1998 | Malhi |
| 5,739,564 A | 4/1998 | Kosa et al. |
| 5,763,905 A | 6/1998 | Harris |
| 5,776,837 A | 7/1998 | Palmour |
| 5,804,483 A | 9/1998 | Harris |
| 5,814,859 A | 9/1998 | Ghezzo et al. |
| 5,831,288 A | 11/1998 | Singh et al. |
| 5,837,572 A | 11/1998 | Gardner et al. |
| 5,851,908 A | 12/1998 | Harris et al. |
| 5,877,041 A | 3/1999 | Fuller |
| 5,877,045 A | 3/1999 | Kapoor |
| 5,885,870 A | 3/1999 | Maiti et al. |
| 5,914,500 A | 6/1999 | Bakowski et al. |
| 5,917,203 A | 6/1999 | Bhatnagar et al. |
| 5,939,763 A | 8/1999 | Hao et al. |
| 5,960,289 A | 9/1999 | Tsui et al. |
| 5,969,378 A | 10/1999 | Singh |
| 5,972,801 A | 10/1999 | Lipkin et al. |
| 5,976,936 A | 11/1999 | Miyajima et al. |
| 5,977,605 A | 11/1999 | Bakowsky et al. |
| 6,020,600 A | 2/2000 | Miyajima et al. |
| 6,025,233 A | 2/2000 | Terasawa |
| 6,025,608 A | 2/2000 | Harris et al. |
| 6,028,012 A | 2/2000 | Wang |
| 6,040,237 A | 3/2000 | Bakowski et al. |
| 6,048,766 A | 4/2000 | Gardner et al. |
| 6,054,352 A | 4/2000 | Ueno |
| 6,054,728 A | 4/2000 | Harada et al. |
| 6,063,698 A | 5/2000 | Tseng et al. |
| 6,083,814 A | 7/2000 | Nilsson et al. |
| 6,096,607 A | 8/2000 | Ueno |
| 6,100,169 A | 8/2000 | Suvorov et al. |
| 6,104,043 A | 8/2000 | Hermansson et al. |
| 6,107,142 A | 8/2000 | Suvorov et al. |
| 6,117,735 A | 9/2000 | Ueno |
| 6,121,633 A | 9/2000 | Singh et al. |
| 6,133,587 A | 10/2000 | Takeuchi et al. |
| 6,136,727 A | 10/2000 | Ueno |
| 6,136,728 A | 10/2000 | Wang |
| 6,165,822 A | 12/2000 | Okuno et al. |
| 6,180,958 B1 | 1/2001 | Cooper, Jr. |
| 6,190,973 B1 | 2/2001 | Berg et al. |
| 6,204,135 B1 | 3/2001 | Peters et al. |
| 6,204,203 B1 | 3/2001 | Narwankar et al. |
| 6,211,035 B1 | 4/2001 | Moise et al. |
| 6,218,254 B1 | 4/2001 | Singh et al. |

(56) References Cited

U.S. PATENT DOCUMENTS

| | | |
|---|---|---|
| 6,218,680 B1 | 4/2001 | Carter, Jr. et al. |
| 6,221,700 B1 | 4/2001 | Okuno et al. |
| 6,228,720 B1 | 5/2001 | Kitabatake et al. |
| 6,238,967 B1 | 5/2001 | Shiho et al. |
| 6,239,463 B1 | 5/2001 | Williams et al. |
| 6,239,466 B1 | 5/2001 | Elasser et al. |
| 6,246,076 B1 | 6/2001 | Lipkin et al. |
| 6,252,258 B1 | 6/2001 | Chang et al. |
| 6,252,288 B1 | 6/2001 | Chang |
| 6,297,100 B1 | 10/2001 | Kumar et al. |
| 6,297,172 B1 | 10/2001 | Kashiwagi |
| 6,303,508 B1 | 10/2001 | Alok |
| 6,316,791 B1 | 11/2001 | Schörner et al. |
| 6,316,793 B1 | 11/2001 | Sheppard et al. |
| 6,329,675 B2 | 12/2001 | Singh et al. |
| 6,344,663 B1 | 2/2002 | Slater, Jr. et al. |
| 6,365,462 B2 | 4/2002 | Baliga |
| 6,365,932 B1 | 4/2002 | Kouno et al. |
| 6,388,271 B1 | 5/2002 | Mitlehner et al. |
| 6,399,996 B1 | 6/2002 | Chang et al. |
| 6,420,225 B1 | 7/2002 | Chang et al. |
| 6,429,041 B1 | 8/2002 | Ryu et al. |
| 6,448,160 B1 | 9/2002 | Chang et al. |
| 6,455,892 B1 | 9/2002 | Okuno et al. |
| 6,475,889 B1 | 11/2002 | Ring |
| 6,515,303 B2 | 2/2003 | Ring |
| 6,524,900 B2 | 2/2003 | Dahlqvist et al. |
| 6,534,367 B2 | 3/2003 | Peake et al. |
| 6,548,333 B2 | 4/2003 | Smith |
| 6,551,865 B2 | 4/2003 | Kumar et al. |
| 6,573,534 B1 | 6/2003 | Kumar et al. |
| 6,593,620 B1 | 7/2003 | Hshieh et al. |
| 6,610,366 B2 | 8/2003 | Lipkin |
| 6,627,539 B1 | 9/2003 | Zhao et al. |
| 6,649,497 B2 | 11/2003 | Ring |
| 6,653,659 B2 | 11/2003 | Ryu et al. |
| 6,696,705 B1 | 2/2004 | Barthelmess et al. |
| 6,703,642 B1 | 3/2004 | Shah |
| 6,743,703 B2 | 6/2004 | Rodov et al. |
| 6,767,843 B2 | 7/2004 | Lipkin et al. |
| 6,861,723 B2 | 3/2005 | Willmeroth |
| 6,936,850 B2 | 8/2005 | Friedrichs et al. |
| 6,946,739 B2 | 9/2005 | Ring |
| 6,956,238 B2 | 10/2005 | Ryu et al. |
| 6,979,863 B2 | 12/2005 | Ryu |
| 7,026,650 B2 | 4/2006 | Ryu et al. |
| 7,074,643 B2 | 7/2006 | Ryu |
| 7,118,970 B2 | 10/2006 | Das et al. |
| 7,125,786 B2 | 10/2006 | Ring et al. |
| 7,221,010 B2 | 5/2007 | Ryu |
| 7,230,275 B2 | 6/2007 | Kumar et al. |
| 7,253,031 B2 | 8/2007 | Takahashi et al. |
| 7,276,747 B2 | 10/2007 | Loechelt et al. |
| 7,279,115 B1 | 10/2007 | Sumakeris |
| 7,304,363 B1 | 12/2007 | Shah |
| 7,365,363 B2 | 4/2008 | Kojima et al. |
| 7,381,992 B2 | 6/2008 | Ryu |
| 7,407,837 B2 | 8/2008 | Tsuji |
| 7,528,040 B2 | 5/2009 | Das et al. |
| 7,544,963 B2 | 6/2009 | Saxler |
| 7,548,112 B2 | 6/2009 | Sheppard |
| 7,649,213 B2 | 1/2010 | Hatakeyama et al. |
| 7,687,825 B2 | 3/2010 | Zhang |
| 7,728,402 B2 | 6/2010 | Zhang et al. |
| 7,829,402 B2 | 11/2010 | Matocha et al. |
| 8,035,112 B1 | 10/2011 | Cooper et al. |
| 9,373,617 B2 * | 6/2016 | Das .................... H01L 27/0629 |
| 2001/0011729 A1 | 8/2001 | Singh et al. |
| 2001/0033502 A1 | 10/2001 | Blair et al. |
| 2001/0055852 A1 | 12/2001 | Moise et al. |
| 2002/0030191 A1 | 3/2002 | Das et al. |
| 2002/0038891 A1 | 4/2002 | Ryu et al. |
| 2002/0047125 A1 | 4/2002 | Fukuda et al. |
| 2002/0072247 A1 | 6/2002 | Lipkin et al. |
| 2002/0102358 A1 | 8/2002 | Das et al. |
| 2002/0121641 A1 | 9/2002 | Alok et al. |
| 2002/0125482 A1 | 9/2002 | Friedrichs et al. |
| 2002/0125541 A1 | 9/2002 | Korec et al. |
| 2002/0185679 A1 | 12/2002 | Baliga |
| 2003/0025175 A1 | 2/2003 | Asano et al. |
| 2003/0107041 A1 | 6/2003 | Tanimoto et al. |
| 2003/0137010 A1 | 7/2003 | Friedrichs et al. |
| 2003/0142513 A1 | 7/2003 | Vinciarelli |
| 2003/0178672 A1 | 9/2003 | Hatakeyama et al. |
| 2003/0201455 A1 | 10/2003 | Takahashi et al. |
| 2004/0016929 A1 | 1/2004 | Nakatsuka et al. |
| 2004/0082116 A1 | 4/2004 | Kub et al. |
| 2004/0183079 A1 | 9/2004 | Kaneko et al. |
| 2004/0207968 A1 | 10/2004 | Martin et al. |
| 2004/0211980 A1 | 10/2004 | Ryu |
| 2004/0212011 A1 | 10/2004 | Ryu |
| 2004/0227231 A1 * | 11/2004 | Maly .................... H01L 25/072 |
| | | 257/724 |
| 2004/0256659 A1 | 12/2004 | Kim et al. |
| 2004/0259339 A1 | 12/2004 | Tanabe et al. |
| 2005/0012143 A1 | 1/2005 | Tanaka et al. |
| 2005/0035364 A1 | 2/2005 | Sano et al. |
| 2005/0104072 A1 | 5/2005 | Slater, Jr. et al. |
| 2005/0139936 A1 | 6/2005 | Li |
| 2005/0151138 A1 | 7/2005 | Slater, Jr. et al. |
| 2005/0152100 A1 | 7/2005 | Rodriguez et al. |
| 2005/0181536 A1 | 8/2005 | Tsuji |
| 2005/0230686 A1 | 10/2005 | Kojima et al. |
| 2005/0275055 A1 | 12/2005 | Parthasarathy et al. |
| 2006/0011128 A1 | 1/2006 | Ellison et al. |
| 2006/0055027 A1 | 3/2006 | Kitabatake et al. |
| 2006/0060884 A1 | 3/2006 | Ohyanagi et al. |
| 2006/0071295 A1 | 4/2006 | Chang |
| 2006/0086997 A1 | 4/2006 | Kanaya et al. |
| 2006/0211210 A1 | 9/2006 | Bhat et al. |
| 2006/0244010 A1 | 11/2006 | Saxler |
| 2006/0255423 A1 | 11/2006 | Ryu et al. |
| 2006/0261347 A1 | 11/2006 | Ryu et al. |
| 2006/0261876 A1 | 11/2006 | Agarwal et al. |
| 2006/0267021 A1 | 11/2006 | Rowland et al. |
| 2006/0270103 A1 | 11/2006 | Das et al. |
| 2007/0066039 A1 | 3/2007 | Agarwal et al. |
| 2007/0090415 A1 * | 4/2007 | Ronsisvalle ...... H01L 29/66378 |
| | | 257/288 |
| 2007/0114606 A1 | 5/2007 | Hoshino et al. |
| 2007/0120148 A1 | 5/2007 | Nogome |
| 2007/0164321 A1 | 7/2007 | Sheppard et al. |
| 2007/0241427 A1 | 10/2007 | Mochizuki et al. |
| 2007/0262324 A1 | 11/2007 | Kaneko |
| 2008/0001158 A1 | 1/2008 | Das et al. |
| 2008/0006848 A1 | 1/2008 | Chen et al. |
| 2008/0029838 A1 | 2/2008 | Zhang et al. |
| 2008/0048258 A1 | 2/2008 | de Fresart et al. |
| 2008/0105949 A1 | 5/2008 | Zhang et al. |
| 2008/0191304 A1 | 8/2008 | Zhang et al. |
| 2008/0224316 A1 * | 9/2008 | Kroeninger ......... H01L 21/6835 |
| | | 257/751 |
| 2008/0230787 A1 | 9/2008 | Suzuki et al. |
| 2008/0251793 A1 | 10/2008 | Mazzola et al. |
| 2008/0258252 A1 | 10/2008 | Shimizu et al. |
| 2008/0277669 A1 | 11/2008 | Okuno et al. |
| 2008/0296771 A1 | 12/2008 | Das et al. |
| 2009/0008709 A1 | 1/2009 | Yedinak et al. |
| 2009/0039498 A1 | 2/2009 | Bayerer |
| 2009/0121319 A1 | 5/2009 | Zhang et al. |
| 2009/0146154 A1 | 6/2009 | Zhang et al. |
| 2009/0212301 A1 | 8/2009 | Zhang et al. |
| 2009/0225578 A1 * | 9/2009 | Kitabatake .......... H01L 29/0696 |
| | | 363/132 |
| 2009/0272982 A1 | 11/2009 | Nakamura et al. |
| 2009/0289262 A1 | 11/2009 | Zhang et al. |
| 2009/0321746 A1 | 12/2009 | Harada et al. |
| 2010/0032685 A1 | 2/2010 | Zhang et al. |
| 2010/0127371 A1 | 5/2010 | Tschirbs |
| 2010/0133549 A1 | 6/2010 | Zhang et al. |
| 2010/0133550 A1 | 6/2010 | Zhang et al. |
| 2010/0140628 A1 | 6/2010 | Zhang |
| 2010/0244047 A1 | 9/2010 | Hull et al. |
| 2010/0295062 A1 | 11/2010 | Uchida et al. |

(56) References Cited

U.S. PATENT DOCUMENTS

| | | | |
|---|---|---|---|
| 2011/0012132 A1 | 1/2011 | Otsuka et al. | |
| 2011/0018004 A1 | 1/2011 | Shimizu et al. | |
| 2011/0018040 A1 | 1/2011 | Smith et al. | |
| 2011/0058293 A1* | 3/2011 | Pardoen | H01L 27/0251 361/56 |
| 2011/0193412 A1 | 8/2011 | Lacarnoy | |
| 2011/0199792 A1 | 8/2011 | Friebe et al. | |
| 2011/0246794 A1 | 10/2011 | Liao | |
| 2011/0292617 A1 | 12/2011 | Darroman et al. | |
| 2012/0044720 A1 | 2/2012 | Shea et al. | |
| 2013/0000170 A1 | 1/2013 | Dueck et al. | |
| 2013/0016542 A1* | 1/2013 | Nakamura | H03K 17/163 363/56.01 |
| 2013/0056755 A1* | 3/2013 | Hatai | H01L 23/49805 257/77 |
| 2013/0307500 A1 | 11/2013 | Nojiri et al. | |

FOREIGN PATENT DOCUMENTS

| | | |
|---|---|---|
| DE | 19832329 A1 | 2/1999 |
| DE | 19900171 A1 | 7/1999 |
| DE | 19817444 C1 | 9/1999 |
| DE | 10036208 A1 | 2/2002 |
| EP | 0176778 A2 | 4/1986 |
| EP | 0372412 A1 | 6/1990 |
| EP | 0389863 A1 | 10/1990 |
| EP | 0637069 A1 | 2/1995 |
| EP | 0837508 A2 | 4/1996 |
| EP | 0735591 A1 | 10/1996 |
| EP | 0865085 A1 | 9/1998 |
| EP | 1058317 A2 | 12/2000 |
| EP | 1361614 A1 | 11/2003 |
| EP | 1460681 A2 | 9/2004 |
| EP | 1503425 A2 | 2/2005 |
| EP | 1693896 A1 | 8/2006 |
| EP | 1806787 A1 | 7/2007 |
| EP | 1845561 A2 | 10/2007 |
| EP | 2015364 A2 | 1/2009 |
| EP | 2124257 A1 | 11/2009 |
| EP | 2432014 A1 | 3/2012 |
| JP | 60240158 A | 11/1985 |
| JP | 1117363 A | 5/1989 |
| JP | 03034466 A | 2/1991 |
| JP | 03157974 A | 7/1991 |
| JP | 3225870 A | 10/1991 |
| JP | 08264766 A | 10/1996 |
| JP | 09205202 A | 8/1997 |
| JP | H10290562 A | 10/1998 |
| JP | 11191559 A | 7/1999 |
| JP | 11238742 A | 8/1999 |
| JP | 11261061 A | 9/1999 |
| JP | 11266017 A | 9/1999 |
| JP | 11274487 A | 10/1999 |
| JP | 2000049167 A | 2/2000 |
| JP | 2000082812 A | 3/2000 |
| JP | 2000106371 A | 4/2000 |
| JP | 2000252461 A | 9/2000 |
| JP | 2000252478 A | 9/2000 |
| JP | 2002314099 A | 10/2002 |
| JP | 2010183840 A | 8/2010 |
| JP | 2011030424 A | 2/2011 |
| JP | 2012156548 A | 8/2012 |
| WO | 9603774 A1 | 2/1996 |
| WO | 9708754 A2 | 3/1997 |
| WO | 9717730 A1 | 5/1997 |
| WO | 9739485 A1 | 10/1997 |
| WO | 9802916 A1 | 1/1998 |
| WO | 9802924 A2 | 1/1998 |
| WO | 9808259 A1 | 2/1998 |
| WO | 9832178 A1 | 7/1998 |
| WO | 9963591 A1 | 12/1999 |
| WO | 0013236 A2 | 3/2000 |
| WO | 0178134 A1 | 10/2001 |
| WO | 2004020706 A1 | 3/2004 |
| WO | 2004079789 A2 | 9/2004 |
| WO | 2005020308 A1 | 3/2005 |
| WO | 2006135031 A2 | 12/2006 |
| WO | 2007040710 A1 | 4/2007 |
| WO | 2009128382 A1 | 10/2009 |
| WO | 2010004715 A1 | 1/2010 |
| WO | 2010074275 A1 | 7/2010 |
| WO | 2013036370 A1 | 3/2013 |

OTHER PUBLICATIONS

U.S. Appl. No. 13/893,998, filed May 14, 2013.

Lai, P.T. et al., "Interface properties of N2O-Annealed NH3-Treated 6H-SiC MOS Capacitor", Proceedings of the IEEE Hong Kong Electron Devices Meeting, Jun. 26, 1999, pp. 46-49.

Leonhard et al. "Long Term Stability of Gate-Oxides on n- and P-Type Silicon Carbide Studied By Charge Injection Techniques," Materials Science Engineering, vol. 46, No. 1-3, Apr. 1997, pp. 263-266.

Levinshtein, Michael E. et al., "On the Homogeneity of the Turn-On Process in High-Voltage 4H-SiC Thyristors", Solid-State Electronics, Feb. 2005, vol. 49, pp. 233-237.

Li, H.F. et al., "Improving SiO2 Grown on P-Type 4H-SiC by NO Annealing", Materials Science Forum, Feb. 1998, vol. 264-268, pp. 869-872.

Li, Y. et al., "High-Voltage (3 kV) UMOSFETs in 4H-SiC", IEEE Transactions on Electron Devices, Jun. 2002, vol. 49, No. 6, pp. 972-975.

Lipkin, L.A. et al., "Low Interfaces State Density Oxides on P-Type SiC", Materials Science Forum, Jan. 1998, vols. 264-268, pp. 853-856.

Lipkin, Lori et al., "Challenges and State-of-the-Art of Oxides on SiC", Material Research Social Symposium Proceedings, Nov. 2000, vol. 640, pp. 89-98.

Lipkin, Lori et al., "Insulator Investigation on SiC for Improved Reliability", IEEE Transactions on Electron Devices, Mar. 1999, vol. 46, No. 3, pp. 525-532.

Losee, P.A. et al., "High-Voltage 4H-SiC PiN Rectifiers with Single-Implant, Multi-Zone JTE Termination", Proceedings for 2004 International Symposium on Power Semiconductor Devices & ICs, May 2004, pp. 301-304.

Losse, P.A. et al., "Degraded Blocking Performance of 4H-SiC Rectifiers Under High dV/dt Conditions", Proceedings for 17th International Symposium on Power Semiconductor Devices & ICs, May 23-26, 2005, pp. 1-4.

Ma, Y. et al., "Fixed and Trapped Charges at Oxide-Nitride-Oxide Heterostructure Interfaces Formed by Remote Plasma Enhanced Chemical Vapor Deposition", American Vacuum Society, Jul. 1993, vol. 11, No. 4, pp. 1533-1540.

Miura, Naruhisa et al., "Successful Development of 1.2 kV 4H-SiC MOSFETs with the Very Low On-Resistance of 5 mΩm2," Proceedings of the 18th International Symposium on Power Semiconductor Devices & IC's, Jun. 4-8, 2006, 4 pages, Naples Italy.

Mondal, K. et al., "An Integrated 500-V Power DMOSFET/ Antiparallel Rectifier Device with Improved Diode Reverse Recovery Characteristics", IEEE Electron Device Letters, Sep. 2002, vol. 23, No. 9, pp. 562-564.

Mutin, P. Hubert, "Control of the Composition and Structure of Silicon Oxycarbide and Oxynitride Glasses Derived from Polysiloxane Precursors", Journal of Sol-Gel Science and Technology, Mar. 1999, pp. 27-38.

Myer-Ward, R.L. et al., "Turning of Basal Plane Dislocations During Epitaxial Growth on 4 Off-Axis 4h-SiC", 7th European Conference on Silicon Carbide and Related Materials, Sep. 7-11, 2008, retrieved Jul. 1, 2009, http://escrm08.com/invited_presentations.html, Barcelona, Spain.

Palmour, J.W. et al., "SiC Device Technology: Remaining Issues", Diamond and Related Materials, Aug. 1997, vol. 5, pp. 1400-1404.

Palmour, John, "Silicon Carbide npnp Thyristors", NASA Tech Briefs. Updated: Dec. 1, 2000, Retrieved Sep. 2, 2010, http://www.techbriefs.com/component/content/article/7031.

(56) References Cited

OTHER PUBLICATIONS

Pankin, D. et al., "Electrical and Microstructural Properties of Highly Boron-Implantation Doped 6H-SiC", Journal of Applied Physics, Mar. 15, 2001, vol. 89, No. 6, pp. 3162-3167.

Pantelides, S.T. et al., "Atomic-Scale Engineering of the SiC-SiO2 Interface", Materials Science Forum, Oct. 1999, vols. 338-342, pp. 1133-1136.

Patel, R. et al., "Phosphorus-Implanted High-Voltage N+P 4H-SiC Junction Rectifiers", Proceedings of 1998 International Symposium on Power Semiconductor Devices & Ics, Jun. 1998, pp. 387-390.

Rao et al., "Al and N Ion Implantations in 6H-SiC," Inst. Phys. Conf. Ser. No. 142, Chapter 3, Jan. 1996, pp. 521-524.

Rao, Mulpuri V. et al., "P-N Junction Formation in 6H-SiC Acceptor Implantation into a N-Type Substrate", Nuclear Instructions and Mechanics in Physics Res., Dec. 1995, vol. 106, pp. 333-338.

Rao, Mulpuri V., "Maturing Ion-Implantation Technology and its Device Applications in SiC", Solid State Electronics, Feb. 2003, vol. 47, pp. 213-222.

Rao, S. et al., "Silane Overpressure Post-Implant Annealing of Al Dopants in SiC: Cold Wall CVD Apparatus", Applied Surface Science, Mar. 2006, vol. 252, pp. 3837-3842.

Richmond, J.T. et al., "Hybrid 4H-SiC MOS Gated Transistor (MGT)", DARPA Contract #N00014-99-C-0377, Sep. 2002, 6 pages.

Ryu, Sei-Hyung et al., "27 mΩ-cm2, 1.6 kV Power DiMOSFETs in 4H-SiC", Proceedings of the 14th International Symposium on Power Semiconductor Devices & ICs 2002, ISPSD '02 Proceedings, Jun. 4-7, 2002, pp. 65-68, Santa Fe, NM.

Salem, T.E. et al., "High-Temperature High-Power Operation of a 100 A SiC DMOSFET Module," Twenty-Fourth Annual IEEE Applied Power Electronics Conference and Exposition, Feb. 2009, pp. 653-657.

Schörner, Reinhold et al., "Rugged Power MOSFETs in 6H-SiC with Blocking Capability up to 1800V", Silicon Carbide and Related Materials, Jan. 2000, vols. 338-342, pp. 1295-1298.

Schörner, Reinhold et al., "Significantly Improved Performance of MOSFET's on Silicon Carbide Using the 15R-SiC Polytype", IEEE Electron Device Letters, May 1999, vol. 20, No. 3, pp. 241-244.

Senzaki, Junji et al., "Effects of Pyrogenic Reoxidation Annealing on Inversion Channel Mobility of 4H-SiC Metal-Oxide-Semiconductor Field-effect Transistor Fabricated on (1120) Face", The Japanese Society of Applied Physics, Nov. 15, 2001, vol. 40, pp. 1201-1203.

Shenoy, Jayarama N. et al., "High-Voltage Double-Implanted Power MOSFET's in 6H-SiC", IEEE Electron Device Letters, Mar. 1997, vol. 18, No. 3, pp. 93-95.

Shenoy, Praveen M. et al., "The Planar 6H-SiC Accufet: A New High-Voltage Power MOSFET Structure", IEEE Electron Device Letters, Sep. 1999, vol. 18, No. 12, pp. 589-591.

Singh, R. et al., "Planar Terminations in 4H-SIC Schottky Diodes with Low Leakage and High Yields", ISPSD '97, May 1997, pp. 157-160.

Singh, R. et al., "High Temperature, High Current, 4H-SiC Accu-DMOSFET", Silicon Carbide and Related Materials, Copyright: 2000, vols. 338-342, pp. 1271-1274.

Sridevan, S. et al., "Lateral N-Channel Inversion Mode 4H-SiC MOSFET'S", IEEE Electron Devices Letters, Jul. 1998, vol. 19, No. 7, pp. 228-230.

Sridevan, S. et al., "On the Presence of Aluminum in Thermally Grown Oxides on 6H-Silicon Carbide", IEEE Electron Devices Letters, Mar. 1996, vol. 17, No. 3, pp. 136-138.

Stengl, R. et al., "Variation of Lateral Doping—A New Concept to Avoid High Voltage Breakdown of Planar Junctions", Science Research Laboratories, Jan. 12, 1985, 4 pages.

Stengl, R. et al., "Variation of Lateral Doping as a Field Terminator for High-Voltage Power Devices", IEEE Transactions on Electron Devices, Mar. 1986, vol. ED-33, No. 3, pp. 426-428.

Streetman, Ben G., "Chapter 7: Bipolar Junction Transistors", Solid State Electronic Devices, Mar. 1980, pp. 228-284, Englewood Cliffs, NJ, Prentice-Hall, Inc.

Sugawara, Yoshitaka et al., "3.6 kV 4H-SiC JBS Diodes with Low RonS", Materials Science Forum: Silicon Carbide and Related Materials, Sep. 2000, vol. 338-342, pp. 1183-1186.

Sundaresan, Siddarth G. et al., "Ultra-Low Resistivity Al+ Implanted 4H-SiC Obtained by Microwave Annealing and a Protective Graphite Cap", Solid-State Electronics 52, Jan. 2008, pp. 140-145.

Suvorov, A.V. et al., "4H-Sic Self-Aligned Implant-Diffused Structure for Power DMOSFETs", Materials Science Forum, Jan. 2000, vols. 338-342, pp. 1275-1278.

Suzuki, Seiji et al., "Effect of Post-Oxidation-Annealing in Hydrogen on SiO2 /4H-SiC Interface", Materials Science Forums, Jan. 2000, vols. 338-342, pp. 1073-1076.

Sze, S.M., "Si-SiO2 MOS Diode", Physics of Semiconductor Devices, 2nd Edition, Jan. 1998, pp. 383-390, Korea, John Wiley & Sons, Inc.

Sze, S.M., "Chapter 5: Bipolar Transistor and Related Devices", Semiconductor Devices Physics and Technology, Jan. 2002, p. 130, United States of America, John Wiley & Sons, Inc.

Tamaki, Tomohiro et al., "Optimization of ON-State and Switching Performances for 15-20-kV 4H-SiC IGBTs," IEEE Transactions on Electron Devices, vol. 55, No. 8, Aug. 2008, pp. 1920-1927.

Tan, J. et al., "High-Voltage Accumulation-Layer UMOSFET's in 4H-SiC", IEEE Electron Device Letters, Sep. 1998, vol. 49, No. 12, pp. 487-489.

Thomas, Chris et al., "Annealing of Ion Implantation Damage in SiC Using a Graphite Mask", Materials Research Society Symposium Proc., Apr. 1999, vol. 572, pp. 45-50.

Tobin, Philip et al., "Furnace Formation of Silicon Oxynitride Thin Dielectrics in Nitrous Oxide N2O: The Role of Nitric Oxide (NO)", Junior Applied Physics, Feb. 1, 1994, vol. 75, No. 3, pp. 1811-1817.

Tone, Kiyoshi et al., "4H-SiC Normally-Off Vertical Junction Field-Effect Transistor With High Current Density," IEEE Electron Device Letters, vol. 24, No. 7, Jul. 2003, pp. 463-465.

Treu, M. et al., "A Surge Current Stable and Avalanche Rugged SiC Merged pn Schottky Diode Blocking 600V Especially Suited for PFC Applications", Materials Science Forum: Silicon Carbide and Related Materials, Oct. 2006, vol. 527-539, pp. 1155-1158.

Ueno, Katsunori et al., "The Guard-Ring Termination for High-Voltage SiC Schottky Barrier Diodes", IEEE Electron Device Letters, Jul. 1995, vol. 16, No. 7, pp. 331-332.

Ueno, Katsunori et al., "4H-SiC MOSFET's Utilizing the H2 Surface Cleaning Technique", IEEE Electron Device Letters, Jul. 1998, vol. 19, No. 7, pp. 244-246.

Ueno, Katsunori et al., "Counter-Doped MOSFET's of 4H-SiC", IEEE Electron Device Letters, Dec. 1999, vol. 20, No. 12, pp. 624-626.

Vassilveski, K. et al., "High Voltage Silicon Carbide Schottky Diodes with Single Zone Junction Termination Extension", Materials Science Forum, Sep. 2007, pp. 873-876, Switzerland, Trans Tech Publications.

Vassilveski, K.V. et al., "Protection of Selectively Implanted and Patterned Silicon Carbide Surfaces with Graphite Capping Layer During Post-Implantation Annealing", Semiconductor Science and Technology, Feb. 3, 2005, pp. 271-278, Switzerland, Trans Tech Publications.

Vathulya, Vickram et al., "A Novel 6H-SiC Power DMOSFET with Implanted P-Well Spacer", IEEE Electron Device Letters, Jul. 1999, vol. 20, No. 7, pp. 354-356.

Vathulya, Vickram et al., "Characterization of Channel Mobility of Implanted SiC to Determine Polytype Suitability for the Power DIMOS Structure", Powerpoint Presentation at Lehigh University, Presented 1999, 26 total slides, 13 pages.

Wang, Xiewen W. et al., "High Temperature Characteristics of High-Quality SiC MIS Capacitors with O/N/O Gate Dielectric", IEEE Transactions on Electron Devices, Feb. 2000, vol. 47, No. 2, pp. 450-462.

Wang, Y. et al., "Accumulation-Mode SiC Power MOSFET Design Issues", Material Science Forum, Feb. 2000, vols. 338-342, pp. 1287-1290.

Williams, J.R. et al., "Passivation of the 4H-SiC/SiO2 Interface with Nitric Oxide", Materials Science Forum, Jan. 2002, vols. 389-393, pp. 967-972.

(56) References Cited

OTHER PUBLICATIONS

Xu, J.P. et al., "Improved Performance and Reliability of N20-Grown Oxynitride on 6H-SiC", IEEE Electron Device Letters, Jun. 2000, vol. 21, No. 6, pp. 298-300.
Yilmaz, Hamza, "Optimization and Surface Charge Sensitivity of High Voltage Blocking Structures with Shallow Junctions", IEEE Transactions on Electron Devices, Jul. 1991, vol. 38, No. 7, pp. 1666-1675.
Zhang, Qingchun at al., "A 10-K Monolithic Darlington Transistor with βforced of 336 in 4H-SiC", Feb. 2009, IEEE Electron Device Letters, Feb. 2009, vol. 30, No. 2, pp. 142-144.
Zhang, Qingchun et al., "12 Kv 4H-SiC p-IGBTs with Record Low Specific On-Resistance", Materials Science Forum, Sep. 2008, vols. 600-603, 4 pages.
Zhang, Qingchun et al., "Design and Fabrications of High Voltage IGBTs on 4H-SiC", Power semiconductor devices and IC's, 2006 IEEE International Symposium, Jun. 4-8, 2006, pp. 1-4.
Office Action for Chinese Patent Application No. 2007800294605, dated Jan. 22, 2010, 7 pages.
European Search Report for European Patent Application No. 09177558.5, dated Feb. 22, 2010, 6 pages.
European Search Report for European Patent Application No. 07120038.0, dated Jun. 16, 2008, 7 pages.
European Search Report for European Patent Application No. 09163424.6, dated Apr. 9, 2010, 10 pages.
Extended European Search Report for European Patent Application No. 07112298.0, dated Feb. 18, 2009, 12 pages.
International Search Report and Written Opinion for International Patent Application No. PCT/US2012/051429 dated Nov. 22, 2012, 15 pages.
International Search Report for International Patent Application No. PCT/US01/30715 dated Jun. 5, 2002, 9 pages.
International Search Report for International Patent Application No. PCT/US01/42414, dated Apr. 23, 2002, 10 pages.
International Search Report for International Patent Application No. PCT/US02/11691, dated Dec. 17, 2002, 9 pages.
International Search Report for International Patent Application No. PCT/US2004/004982 dated Jul. 22, 2004, 13 pages.
International Search Report for International Patent Application No. PCT/US2010/025053, dated Jul. 2, 2010, 14 pages.
International Search Report and Written Opinion for International Patent Application No. PCT/US2012/27255 dated Jun. 13, 2012, 10 pages.
International Search Report and Written Opinion for International Patent Application No. PCT/US2007/0014139, dated Feb. 4, 2008, 15 pages.
International Search Report and Written Opinion for International Patent Application No. PCT/US2008/0008574, dated Sep. 26, 2008, 15 pages.
International Search Report and Written Opinion for International Patent Application No. PCT/US2008/0010538, dated Dec. 22, 2008, 13 pages.
International Search Report for International Patent Application No. PCT/US2009/0000734, dated Apr. 23, 2009, 13 pages.
International Search Report and Written Opinion for International Patent Application No. PCT/US2009/0003089, dated Aug. 20, 2009, 16 pages.
International Search Report and Written Opinion for International Patent Application No. PCT/US2009/0065251, dated Jun. 1, 2010, 14 pages.
International Search Report and Written Opinion for International Patent Application No. PCT/US2010/0020071, dated Mar. 26, 2010, 14 pages.
Invitation to Pay Additional Fee for International Patent Application No. PCT/US2007/0010192, dated Oct. 29, 2007, 10 pages.
International Search Report and Written Opinion for International Patent Application No. PCT/US2008/004239, dated Mar. 2, 2009, 14 pages.
International Search Report and Written Opinion for International Patent Application No. PCT/US2010/0026632, dated Oct. 8, 2010, 13 pages.
International Search Report and Written Opinion for International Patent Application No. PCT/US2010/0028612, dated Jun. 17, 2010, 9 pages.
International Search Report and Written Opinion for International Patent Application No. PCT/US2010/0035713, dated Jul. 27, 2010, 11 pages.
International Search Report and Written Opinion for International Patent Application No. PCT/US2010/0042075, dated Sep. 24, 2010, 15 pages.
Non-Final Office Action for U.S. Appl. No. 13/108,440, dated Aug. 2, 2012, 23 pages.
Non-Final Office Action for U.S. Appl. No. 13/102,510, dated Aug. 2, 2012, 32 pages.
Final Office Action for U.S. Appl. No. 13/108,440, dated Jan. 17, 2013, 36 pages.
Final Office Action for U.S. Appl. No. 13/102,510, dated Feb. 12, 2013, 27 pages.
Advisory Action for U.S. Appl. No. 13/108,440, dated Mar. 25, 2013, 4 pages.
Advisory Action for U.S. Appl. No. 13/102,510, dated Apr. 19, 2013, 3 pages.
Non-Final Office Action for U.S. Appl. No. 13/102,510, dated Jun. 20, 2013, 28 pages.
Restriction Requirement for U.S. Appl. No. 13/588,329, dated Aug. 26, 2013, 7 pages.
Report of Reexamination before Appeal for Japanese Patent Application No. 2014-529750, dated Aug. 18, 2016, 6 pages.
Advisory Action for U.S. Appl. No. 13/893,998, dated Aug. 31, 2016, 3 pages.
Second Office Action for Chinese Patent Application No. 201280055081.4, dated Nov. 8, 2016, 20 pages.
International Preliminary Report on Patentability for No. PCT/US2015/030853, dated Nov. 24, 2016, 10 pages.
Notice of Allowance for U.S. Appl. No. 13/588,329, dated Dec. 23, 2016, 10 pages.
Notice of Allowance for U.S. Appl. No. 13/893,998, dated Dec. 15, 2016, 9 pages.
Non-Final Office Action for U.S. Appl. No. 13/588,329, dated Jun. 27, 2016, 19 pages.
International Preliminary Report on Patentability for International Application No. PCT/US2012/051429, dated Mar. 20, 2014, 9 pages.
Non-Final Office Action for U.S. Appl. No. 13/588,329, dated Apr. 22, 2014, 21 pages.
International Search Report and Written Opinion for PCT/US2014/037977, dated Sep. 15, 2014, 11 pages.
Non-Final Office Action for U.S. Appl. No. 13/588,329, dated Sep. 24, 2014, 16 pages.
Afanasev, V. et al., "Intrinsic SiC/SiO2 Interface States", Phys. Stat. Sol., Jan. 31, 1997, vol. 162, pp. 321-337.
Agarwal et al., "9kV, 1xcm SiC Super GTO Technology Development for Pulse Power," Pulsed Power Conference, 2009, presented Jun. 28-Jul. 2, 2009, pp. 264-269.
Agarwal, A.K. et al., "700-V Assymetrical 4H-SiC Gate Turn-Off Thyristors (GTO's)," IEEE Electron Device Letters, vol. 18, No. 11, Nov. 1997, pp. 518-520.
Agarwal, A.K. et al., "1.1 kV 4H-SiC Power UMOSFETs", IEEE Electron Devices Letters, Dec. 1997, vol. 18, No. 12, pp. 586-588.
Agarwal, A.K. et al., "1400 V 4H-SiC Power MOSFETs", Materials Science Forum, Jan. 1998, vols. 264-268, pp. 989-992.
Agarwal, A.K. et al., "A Critical Look at the Performance Advantages and Limitations of 4H-SiC Power UMOSFET Structures", Proceedings of the International Symposium on Power Semiconductor Devices and IC's, May 20-23, 1996, pp. 119-122.
Agarwal, A.K. et al., "Investigation of Lateral RESURF, 6H-SiC MOSFETs", Materials Science Forum, Copyright: 2000, vols. 338-342, pp. 1307-1310.
Agarwal, A.K. et al., "Temperature Dependence of Fowler-Nordheim Current in 6H- and 4H-SiC MOS Capacitors", IEEE Electron Device Letters, Dec. 1997, vol. 18, No. 12, pp. 592-594.

(56) References Cited

OTHER PUBLICATIONS

Alok, Dev. et al., "Process Dependence of Inversion Layer Mobility in 4H-SiC Devices", Silicon Carbide and Related Materials, Oct. 10-15, 1999, pp. 1077-1080.
Asano, K. et al., "Dynamic Characteristics of 6.2 kV High Voltage 4H-SiC pn Diode with Low Loss", Transactions of the Institute of Electrical Engineers of Japan, May 2003, vol. 123-D, No. 5, pp. 623-627.
Author Unknown, "Definition of Overlap," The American Heritage Dictionary of the English Language, Fourth Edition, Sep. 2003, 3 pages, http://www.thefreedictionary.com/overlap.
Author Unknown, "Insulated-Gate Bipolar Transistor," Wikipedia—The Free Encyclopedia, Jun. 21, 2010, 6 pages, http://en.wikipedia.org/wiki/Insulated-gate_bipolar_transistor.
Author Unknown, "Motorola Power MOSFET Transistor Databook", 4th Edition, Motorola, Inc., Copyright: 1989, pp. 254-257.
Author Unknown, "The Insulated Gate Biopolar Transistor (IGBT)", University of Glasgow, Updated: Feb. 14, 2007, Retrieved Jul. 7, 2006, http://www.elec.gla.ac.uk/groups/dev_mod/papers/igbt/igbt.html.
Ayalew, T., "4.4.3.1 MPS Diode Structure", Tu Wien. Jul. 6, 2006, http://www.iue.tuwien.ac.at/phd/ayalew/node88.html.
Baliga, B., "Chapter 7: Power Mosfet", Power Semiconductor Devices, May 2, 1995, pp. 335-425, Boston, MA, PWS Publishing Company.
Baliga, B., "Chapter 8: Insulated Gate Bipolar Transistor", Power Semiconductor Devices, May 2, 1995, pp. 426-502, Boston, MA, PWS Publishing Company.
Bhatnagar et al., "Comparison of 6H-SiC, 3C-SiC, and Si for power devices," Transactions on Electron Devices, vol. 40, No. 3, Mar. 1993, pp. 645-655.
Buchner, R. et al., "Laser Recrystallization of Polysilicon for Improved Device Quality", Springer Proceedings in Physics, Copyright: 1989, vol. 55, pp. 289-294.
Capano, M.A. et al., "Ionization Energies and Electron Mobilities in Phosphorus- and Nitrogen-Implanted 4H Silicon Carbide", IEEE ICSCRM Conference 1999, Oct. 10-13, 1999, 4 pages.
Capano, M.A. et al., "Surface Roughening in Ion Implanted 4-H Silicon Carbide", Journal of Electronic Materials, Jul. 20, 1998, vol. 28, No. 3, pp. 214-218.
Casady, J.B. et al., "900 V DMOS and 1100 V UMOS 4H-SiC Power FETs", Northrop Grumman Science and Technology Center, Published: 1997, 2 Pages.
Chakraborty, Supratic et al., "Interface Properties of N2O-Annealed SiO2/SiC System", 2008 IEEE Proceedings of the Electron Devices Meeting, Dec. 15-17, 2000, pp. 108-111, Hong Kong.
Chang, H.R. et al., "500-V n-Channel Insulated-Gate Bipolar Transistor with a Trench Gate Structure," IEEE Transactions on Electron Devices, vol. 36, No. 9, Sep. 1989, pp. 1824-1829.
Chang, K.C. et al., "Observation of a Non-Stoichiometric Layer at the Silicon Dioxide—Silicon Carbide Interface: Effect of Oxidation Temperature and Post-Oxidation Processing Conditions", Materials Research Social Symposium Procedures, vol. 640, Nov. 29-Dec. 2, 2011, 6 pages.
Chen, Jia-Rong et al., "Theoretical Analysis of Current Crowding Effect in Metal/AlGaN/GaN Schottky Diodes and its Reduction by Using Polysilicon in Anode", Chinese Physics Letters, Jul. 2007, vol. 24, No. 7, pp. 2112-2114.
Cho, Won-Ju et al., "Improvement of Charge Trapping by Hydrogen Post-Oxidation Annealing in Gate Oxide of 4H-SiC metal-oxide-semiconductor capacitors", Applied Physical Letters, Aug. 21, 2000, vol. 77, No. 8, 1215-1217.
Chung, G.Y. et al., "The Effect of Si:C Source Ratio on S1O2 /SiC Interface State Density for Nitrogen Doped 4H and 6H SiC", Materials Science Forum, Copyright: 2000, vol. 338-342, pp. 1097-1100.
Chung, G.Y. et al., "Effect of Nitric Oxide Annealing on the Interface Trap Densities Near the Band Edges in the 4H Polytype Silicon Carbide", Applied Physics Letters, Mar. 27, 2000, vol. 76, No. 13, pp. 1713-1715.
Chung, G.Y. et al., "Improved Inversion Channel Mobility for 4h-SiC MOSFETs Following High Temperature Anneals in Nitric Oxide", IEEE Electron Device Letters, Apr. 2001, vol. 22, No. 4, pp. 176-178.
Chung, Gilyong et al., "Effects of Anneals in Ammonia on the Interface Trap Density Near the Band Edges in 4H-Silicon Carbide Metal-Oxide-Semiconductor Capacitors", Applied Physical Letters, Nov. 27, 2000, vol. 77, No. 22, pp. 3601-3603.
Dahlquist, F. et al., "A 2.8kV, Forward Drop JBS Diode with Low Leakage", Materials Science Forum, Jan. 2000, vols. 338-342, pp. 1179-1182.
Das, M.K. et al., "High Mobility 4H-SiC Inversion Mode MOSFETs Using Thermally Grown", No Annealed SiO2,, IEEE 58th Device Research Conference, Jun. 19-21, 2000, 3 Pages.
Das, M.K. et al., "Inversion Channel Mobility in 4H- and 6H-SiC MOSFETs", School of Electrical and Computer Engineering at Purdue University, Published: 1998, 2 pages.
Das, Mrinal K. et al., "A 13 kV 4H-SiC n-Channel IGBT with Low Rdiff on and Fast Switching", DARPA Contract, Sep. 2008, 4 Pages.
Das, Mrinal K., "Fundamental Studies of the Silicon Carbide MOS Structure", Thesis submitted to Purdue University for Doctorate of Philosophy Program, Dec. 1999, 160 Pages.
Dastidar, Sujoyita, "A Study of P-Type Activation in Silicon Carbide", Thesis submitted to Faculty of Purdue University, May 1998, 102 Pages.
De Meo, R.C. et al., "Thermal Oxidation of SiC in N2O", The Electrochemical Society, Inc., Nov. 1994, vol. 141, No. 11, pp. L150-L152.
Del Prado, A. et al., "Full Composition Range Silicon Oxynitride Films Deposited by ECR-PECVD at Room Temperature", Thin Solid Films, Apr. 1999, vols. 343-344, pp. 437-440.
Dimitrijev, Sima et al., "Nitridation of Silicon-Dioxide Films Grown on 6H Silicon Carbide", IEEE Electron Device Letters, May 1997, vol. 18, No. 5, pp. 175-177.
Fisher, C.A. et al., "The Performance of High-Voltage Field Relieved Schottky Barrier Diodes", IEE Proceedings, Dec. 1985, vol. 132, Pt. 1, No. 6, pp. 257-260.
Fuda, Kenji et al., "Improvement of SiO2/4H-SiC Interface by Using High Temperature Hydrogen Annealing at 1000° C", External Abstracts of the 1998 International Conference on Solid State Devices and Materials, Published: 1998, pp. 100-101.
Fukuda, Kenji et al., "Improvement of SiO2/4H-SiC Interface Using High-Temperature Hydrogen Annealing at Low Pressure and Vacuum Annealing", Japanese Journal of Applied Physics, Apr. 1999, vol. 38, pp. 2306-2309.
Hubel, Kerstin, "Hybrid Design Improves Diode Robustness and Boosts Efficiency", Compound Semiconductor. Net, Updated: May 2006, Retrieved: Jul. 7, 2006, http://www.compoundsemiconductor.net.
Hull, Brett A. et al., "Drift-Free 10-kV, 20-A 4H-SiC PiN Diodes", Journal of Electronic Materials, Apr. 2005, vol. 34, No. 4, pp. 341-344.
Jamet, P. et al., "Physical Properties of N/sub 2/0 and No—Nitrided Fate Oxides Grown on 4H SiC", Applied Physics Letters, Jul. 2001, vol. 79, No. 3, pp. 323-325.
Kinoshita, Kozo et al., "Guard Ring Assisted RESURF: A New Termination Structure Providing Stable and High Breakdown Voltage for SiC Power Devices", Proceedings of the 14th International Symposium on Power Semiconductor Devces and ICs, Jun. 7, 2002, pp. 253-256.
Kobayashi, K. et al., "Dielectric Breakdown and Current Conduction of Oxide/Nitride/Oxide Multi-Layer Structures", 1990 Symposium of VLSI Technology, Jun. 4-7, 1990, pp. 119-120.
Krishnaswami, Sumi et al., "High Temperature Characterization of 4H-SiC Bipolar Junction Transistors", Materials Science Forum, Jan. 1, 2009, vols. 527-529, pp. 1437-1440.

(56) References Cited

OTHER PUBLICATIONS

Lai, P.T. et al., "Effects of Nitridation and Annealing on Interface Properties of Thermally Oxidized SIO2 /SiC Metal-Oxide-Semiconductor System", Applied Physics Letters, Jun. 19, 2000, vol. 75, No. 25, pp. 3744-3748.
Berning, David W. et al., "High-Voltage Isolated Gate Drive Circuit for 10 kV, 100 A SiC MOSFET/JBS Power Modules," IEEE Industry Applications Society Annual Meeting, Oct. 5-9, 2008, IEEE, pp. 1-7.
Grider, David et al., "10kV/120 A SiC DMOSFET Half H-Bridge Power Modules for 1 MVA Solid State Power Substation," IEEE Electric Ship Technologies Symposium (ESTS), Apr. 10-13, 2011, IEEE, pp. 131-134.
Mauch, Daniel et al., "High Power Lateral Silicon Carbide Photoconductive Semiconductor Switches and Investigation of Degradation Mechanisms," IEEE Transactions on Plasma Science, vol. 43, Issue 6, Jun. 2015, IEEE, pp. 2021-2031.
Moran, S.L. et al., "Hydrogen spark switches for rep-rated accelerators," 9th International Conference on High-Power Particle Beams, May 25-29, 1992, IEEE, 1 page, Abstract.
Rognlien, S., "Electric power supply with rectifier installation for the Alnor aluminum works at Karmoy," Elektroteknisk Tidsskrift, vol. 81, Issue 20, Oct. 17, 1968, Oslo, Ingeniørforlaget, 1 page, Abstract.
Wang, Jun et al., "Characterization, Modeling, and Application of 10-kV SiC MOSFET," IEEE Transactions on Electron Devices, vol. 55, Issue 8, Aug. 2008, IEEE, pp. 1798-1806.
Yu, Lei et al., "Design of 150 kV all-solid-state high voltage pulsed power generator," High Power Laser and Particle Beams, vol. 24, Issue 3, Mar. 2012, Nuclear Society of China, 1 page, Abstract.
Zorngiebel, Volker et al., "Modular 50-kV IGBT Switch for Pulsed-Power Applications," IEEE Transactions on Plasma Science, vol. 39, Issue 1, Jan. 2011, IEEE, pp. 364-367.
Corrected Notice of Allowability for U.S. Appl. No. 13/588,329, dated Jan. 25, 2017, 7 pages.
Corrected Notice of Allowability for U.S. Appl. No. 13/588,329, dated Mar. 13, 2017, 7 pages.
Examination Report for European Patent Application No. 12762112.6, dated Feb. 1, 2017, 4 pages.
Notice of Allowability for U.S. Appl. No. 13/893,998, dated Jan. 10, 2017, 6 pages.
Corrected Notice of Allowability for U.S. Appl. No. 13/893,998, dated Jan. 25, 2017, 6 pages.
Corrected Notice of Allowability for U.S. Appl. No. 13/893,998, dated Feb. 16, 2017, 6 pages.
Corrected Notice of Allowability for U.S. Appl. No. 13/893,998, dated Mar. 14, 2017, 6 pages.
Third Office Action for Chinese Patent Application No. 201280055081.4, dated Apr. 1, 2017, 19 pages.
Decision on Appeal for Japanese Patent Application No. 2014-529750, dated May 10, 2017, 41 pages.
Corrected Notice of Allowability and Response to Rule 312 Communication for U.S. Appl. No. 13/893,998, dated Mar. 30, 2017, 7 pages.
Notice of Reasons for Rejection for Japanese Patent Application No. 2016-567562, dated Mar. 13, 2018, 8 pages.
Non-Final Office Action for U.S. Appl. No. 15/482,936, dated Feb. 23, 2018, 12 pages.
Non-Final Office Action for U.S. Appl. No. 15/483,039, dated Feb. 22, 2018, 22 pages.

\* cited by examiner

HIGH CURRENT, LOW SWITCHING LOSS SIC POWER MODULE

RELATED APPLICATIONS

This application is a continuation of U.S. patent application Ser. No. 14/277,820, filed May 15, 2014, which is a continuation-in-part of U.S. patent application Ser. No. 13/893,998, filed May 14, 2013, which is a continuation-in-part of U.S. patent application Ser. No. 13/588,329, filed Aug. 17, 2012, which claims the benefit of U.S. provisional patent application No. 61/533,254, filed Sep. 11, 2011, the disclosures of which are hereby incorporated herein by reference in their entirety.

FIELD OF THE DISCLOSURE

The present disclosure relates to power modules for controlling power delivery to a load.

BACKGROUND

As power costs continue to rise and environmental impact concerns mount, the demand for power devices with increased performance and efficiency continues to grow. One way to improve the performance and efficiency of a power device is by fabricating the device using silicon carbide (SiC). Power devices made with SiC are expected to show great advantages compared to conventional silicon power devices in switching speed, power handling capability, and temperature handling capability. Specifically, the high critical field and wide band gap of SiC devices allows for increases in both performance and efficiency when compared to conventional silicon devices.

Due to the performance limitations inherent in silicon, a conventional power device may require a bipolar structure, such as that of an insulated gate bipolar transistor (IGBT), when blocking high voltages (e.g., voltages greater than 5 kV). While utilizing a bipolar structure generally decreases the resistance of the drift layer due to conductivity modulation thereof, bipolar structures also suffer from relatively slow switching times. As will be appreciated by those of ordinary skill in the art, the reverse recovery time (attributed to the relatively slow diffusion of minority carriers) of a bipolar structure limits the maximum switching time thereof, thereby making silicon devices generally unsuitable for high voltage and high frequency applications.

Due to the performance enhancements discussed above with respect to SiC power devices, unipolar SiC power devices may be used to block voltages up to 10 kV or more. The majority carrier nature of such unipolar SiC power devices effectively eliminates the reverse recovery time of the device, thereby allowing for very high switching speeds (e.g., less than 100 ns for a double-diffused metal-oxide-semiconductor field-effect transistor (DMOSFET) with a 10 kV blocking capability and a specific on-resistance of about 100 m$\Omega$*cm$^2$).

Power devices are often interconnected and integrated into a power module, which operates to dynamically switch large amounts of power through various components such as motors, inverters, generators, and the like. As discussed above, due to the rising cost of power and environmental impact concerns, there is a continuing need for power modules that are smaller, less expensive to manufacture, and more efficient, while simultaneously providing similar or better performance than their conventional counterparts.

SUMMARY

The present disclosure relates to power modules for controlling power delivery to a load. According to one embodiment, a power module includes a housing with an interior chamber and multiple switch modules mounted within the interior chamber of the housing. The switch modules are interconnected and configured to facilitate switching power to a load. Each one of the switch modules includes at least one transistor and at least one diode. Together, the switch modules are able to block 1200 volts, conduct 300 amperes, and have switching losses of less than 20 milli-Joules. By including switching modules in the power module such that the power module has switching losses of less than 20 milli-Joules for a 1200V/300A rating, the performance of the power module is significantly improved when compared to conventional power modules.

According to one embodiment, a power module includes a housing with an interior chamber, at least one power substrate within the interior chamber, and a gate connector. The power substrate includes a switch module on a first surface of the power substrate for facilitating switching power to a load. The switch module includes at least one transistor and at least one diode. The gate connector is coupled to a gate contact of the at least one transistor via a signal path that includes a first conductive trace on the first surface of the power substrate. Using a conductive trace on the first surface of the power substrate to connect the gate connector to the gate of the at least one transistor reduces interference in the power module and increases the reliability of the connection between the gate connector and the gate contact of the at least one transistor.

According to one embodiment, a power module includes a housing with an interior chamber, a pair of output contacts, and a plurality of switch modules. The plurality of switch modules are mounted within the interior chamber of the housing, and are interconnected to facilitate switching power from a power source coupled between the output contacts to a load. The pair of output contacts are arranged such that an area of at least 150 mm$^2$ of each one of the output contacts is located less than 1.5 mm from the other output contact. Providing an area of each output contact of at least 150 mm$^2$ that is less than 1.5 mm from the other output contact reduces the leakage inductance between the output contacts, thereby increasing the performance of the power module.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
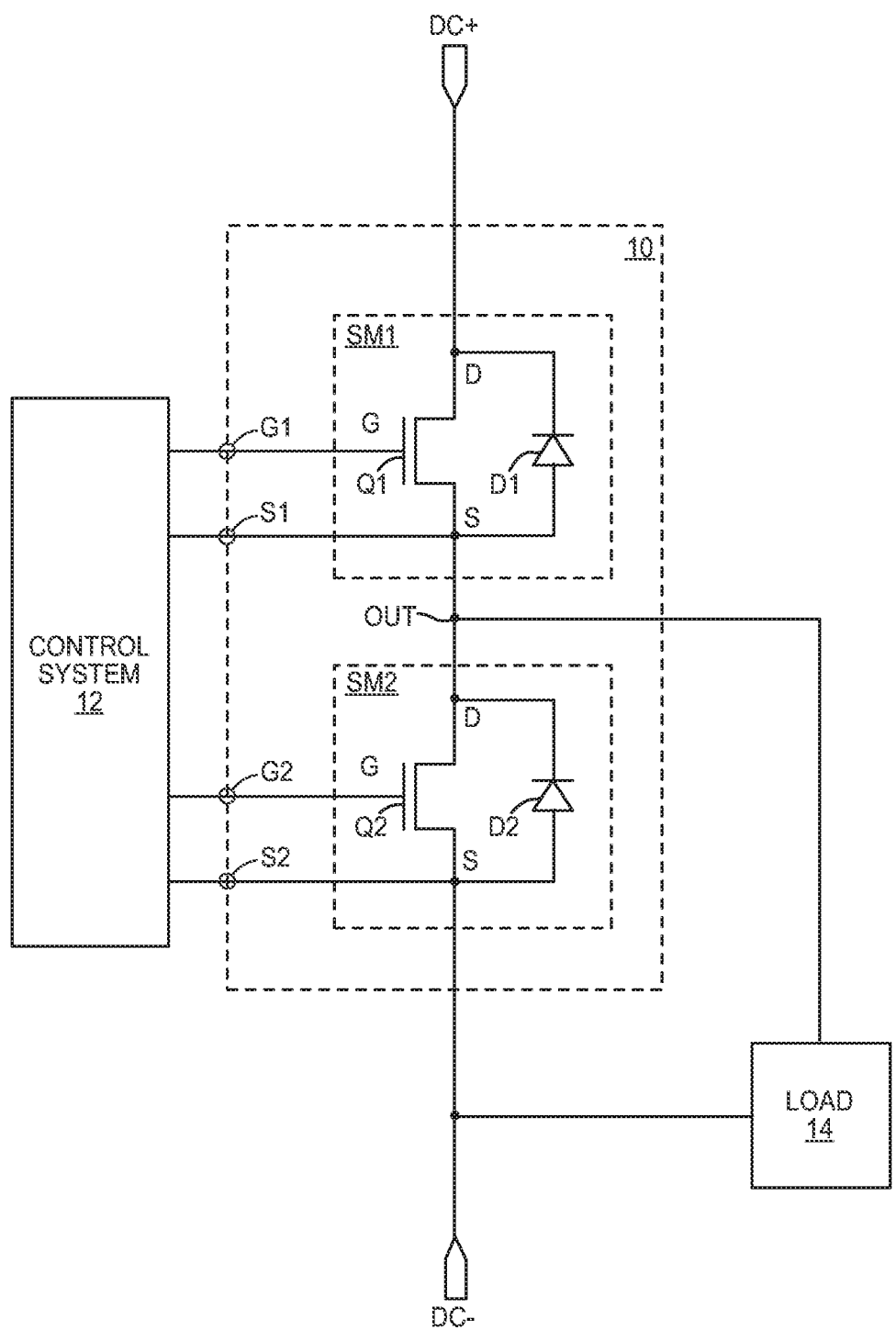
FIG. 1 is a schematic illustrating the details of a power module according to one embodiment of the present disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

FIG. 1 shows an exemplary power module 10 according to one embodiment of the present disclosure. The power module 10 includes two switch modules SM1 and SM2, which are controlled by a control system 12 to deliver power from a power supply (DC+/DC−) to a load 14 in a controlled manner. As will be appreciated by those of ordinary skill in the art, the switch modules SM1 and SM2 form a half-bridge, the details of which are discussed below. Each one of the switch modules SM1 and SM2 includes at least a first transistor in anti-parallel with a first diode. Specifically, a first switch module SM1 includes a first transistor Q1 in anti-parallel with a first diode D1, and a second switch module SM2 includes a second transistor Q2 in anti-parallel with a second diode D2. In one embodiment, the first transistor Q1 and the second transistor Q2 are metal-oxide-semiconductor field-effect transistors (MOSFETs). However, those of ordinary skill in the art will appreciate that any suitable switching device, for example, insulated gate bipolar transistors (IGBTs), field-effect transistors (FETs), junction field-effect transistors (JFETs), high electron mobility transistors (HEMTs), or the like, may be used in the switching modules SM1 and SM2 without departing from the principles of the present disclosure. The first diode D1 and the second diode D2 may be Schottky diodes, and in particular, junction barrier Schottky diodes. Again, those of ordinary skill in the art will appreciate that any suitable diode device, for example, P-N diodes and PiN diodes, may be used in the switching modules SM1 and SM2 without departing from the principles of the present disclosure. In one embodiment, the first diode D1 and the second diode D2 are omitted, and their functionality is replaced by the internal body diode of the first transistor Q1 and the second transistor Q2, respectively. Using the internal body diode of the first transistor Q1 and the second transistor Q2 in place of the first diode D1 and the second diode D2 may save space and cost in the power module 10.

A gate contact G of the first transistor Q1 and a source contact S of the first transistor Q1 are coupled to the control system 12. Similarly, a gate contact G and a source contact S of the second transistor Q2 are also coupled to the control system 12. Notably, the connection from the gate contact G to the first transistor Q1 and the second transistor Q2 to the control system 12 may be accomplished via a relatively low power gate connector G1 and G2, respectively. Similarly, the connection from the source contact S of the first transistor Q1 and the second transistor Q2 to the control system 12 may be accomplished via a low-power source return connection S1 and S2 used to measure one or more operational parameters of the first transistor Q1 or the second transistor Q1, respectively. A drain contact D of the first transistor Q1 is coupled to a positive power supply terminal DC+. A drain contact D of the second transistor Q2 is coupled to an output terminal OUT. The source contact S of the first transistor Q1 is also coupled to the output terminal OUT. The source contact S of the second transistor Q2 is coupled to a negative power supply terminal DC−. Finally, the load 14 is coupled between the output terminal OUT and the negative DC power supply terminal DC−.

The first transistor Q1, the first diode D1, the second transistor Q2, and the second diode D2 may each be majority carrier devices. Majority carrier devices generally include FETs such as MOSFETs, HEMTs, JFETs, and the like, but do not include thyristors, bipolar transistors, and insulated gate bipolar transistors (IGBTs). Accordingly, the power module 10 may be capable of operating at higher switching speeds and suffer lower switching losses when compared to a conventional power module employing bipolar devices. In one embodiment, the first transistor Q1, the first diode D1, the second transistor Q2, and the second diode D2 are wide band-gap devices. For purposes of the present disclosure, a wide band-gap device is a semiconductor device with a band-gap greater than or equal to 3.0 electron-volts (eV). For example, the first transistor Q1, the first diode D1, the second transistor Q2, and the second diode D2 may be silicon carbide (SiC) or gallium nitride (GaN) devices. For reference purposes, Si has a bandgap of approximately 1.1 eV, while SiC has a band-gap of approximately 3.3 eV. As discussed above, using SiC for the first transistor Q1, the first diode D1, the second transistor Q2, and the second diode D2, significantly reduces the switching time of each one of the devices when compared to a conventional silicon (Si) IGBT-based power module, and further suffers lower switching losses. For example, if the power module 10 is rated at 1200V and 300A, the power module 10 may maintain switching losses of less than 25 milli-Joules (mJ), less than 20 mJ, and even less than 15 mJ in various embodiments when operating between −40 C and 150 C, while also providing a low on-state voltage drop. As will be appreciated by those of ordinary skill in the art, the switching losses of the power module 10 generally will not fall below 1 mJ. In an additional embodiment, the first transistor Q1, the first diode D1, the second transistor Q2, and the second diode D2 are both majority carrier devices and wide band-gap devices.

Figure 2:
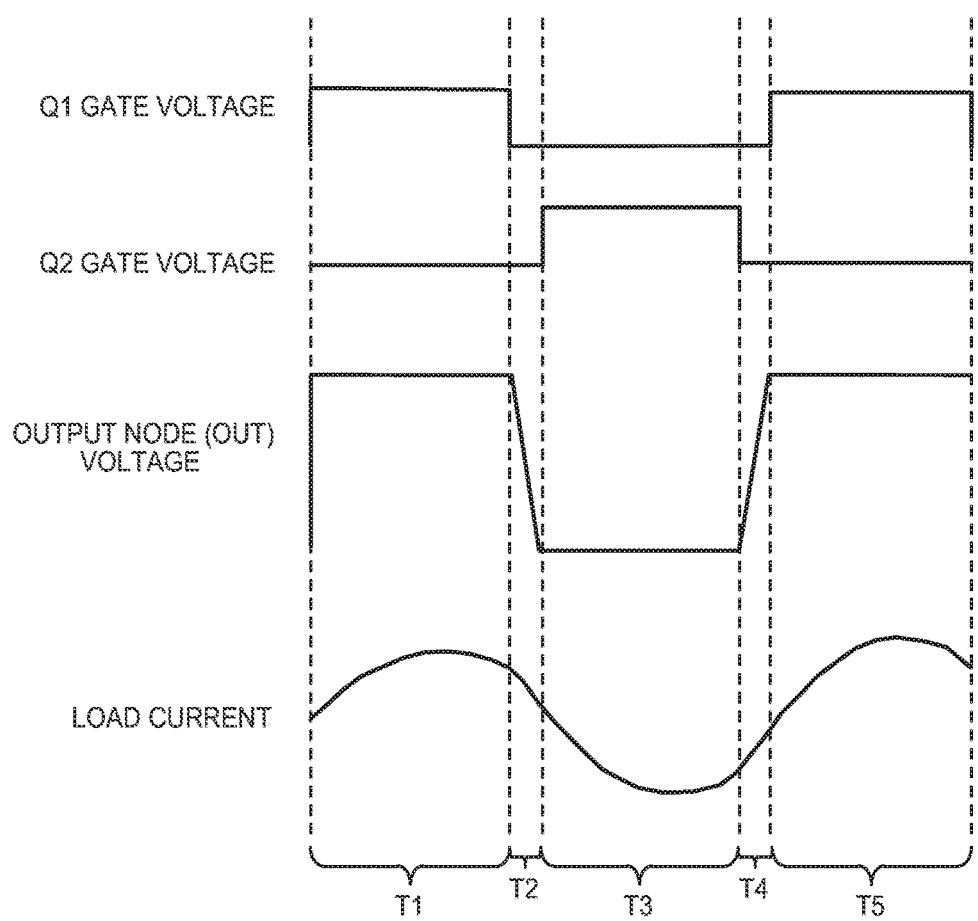
FIG. 2 is a graph illustrating the various signals produced by the power module shown in FIG. 1.

In operation, the control system 12 operates the first switching module SM1 and the second switching module SM2 in a complementary fashion, such that when the first switching module SM1 is conducting, the second switching module SM2 is blocking, and vice-versa. A graph showing the voltage at the gate contact G of the first transistor Q1, the voltage at the gate contact G of the second transistor Q2, the voltage at the output terminal OUT, and the current through the load 14 over the course of a switching cycle of the power module 10 is shown in FIG. 2. During a first time period T1 the first switching module SM1 is conducting, while the second switching module SM2 is blocking. Accordingly, the output terminal OUT is connected to the positive power supply terminal DC+, thereby providing a positive power supply voltage to the load 14 and causing current to flow from the positive power supply terminal DC+ through the first transistor Q1 and into the load 14. Generally, the load 14 is an inductive load, thereby causing the current through the load 14 to slowly ramp up while the first switching module SM1 is conducting.

During a second time period T2, the first switching module SM1 is switched to a blocking mode. Further, the second switching module SM2 remains in a blocking mode. In this time period, current continues to flow to the load 14 from the output terminal OUT due to the internal capacitances associated with each one of the first switching module SM1 and the second switching module SM2. Specifically, about half of the current through the load 14 is provided by the internal capacitance of each one of the switching modules SM1 and SM2. The voltage at the output terminal OUT therefore slews to ground at a given rate, and the current through the load 14 gradually decreases.

As the second switching module SM2 is switched to a conducting mode in a third time period T3, the output terminal OUT is coupled to the negative power supply terminal DC−, which may be ground in some embodiments. Accordingly, current flows through the second transistor Q2 and into the load 14 through the output terminal OUT, causing the current to become increasingly negative.

During a fourth time period T4, the second switching module SW2 is switched to a blocking mode. Further, the first switching module SM1 remains in a blocking mode. In this time period, a negative current continues to flow to the load from the output terminal OUT due to the internal capacitances associated with each one of the first switching module SM1 and the second switching module SM2. Specifically, about half of the current through the load 14 is provided by the internal capacitance of each one of the switching modules SM1 and SM2. The voltage at the output terminal OUT therefore slews from ground to the positive power supply voltage provided at the positive power supply terminal DC+, and the current through the load 14 becomes increasingly positive. Finally, during a fifth time period T5, the switching cycle starts over, such that the first switching module SM1 is placed in a conducting mode while the second switching module SM2 remains in a blocking mode.

Figure 3:
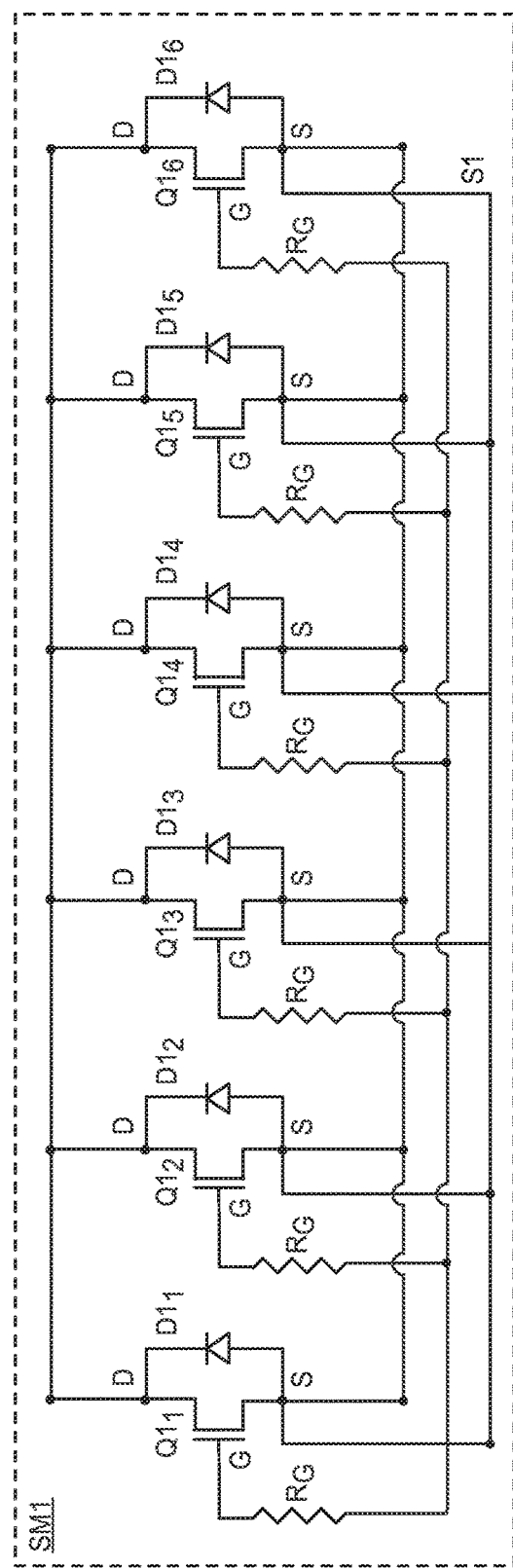
FIG. 3 is a schematic illustrating the details of the switching modules in the power module shown in FIG. 1.

FIG. 3 shows details of the first switching module SM1 according to one embodiment of the present disclosure. The second switching module SM2 may be configured similarly to the first switching module SM2, but is not shown for brevity. As shown in FIG. 3, the first transistor Q1 and the first diode D1 of the first switching module SM1 may include multiple transistors $Q1_{1-6}$ and multiple anti-parallel diodes $D1_{1-6}$ coupled in parallel. Specifically, the drain contacts D of each one of a number of transistors $Q1_{1-6}$ may be coupled together, the source contacts S of each one of the transistors $Q1_{1-6}$ may be coupled together, and the gate contacts G of each one of the transistors $Q1_{1-6}$ may each be coupled together through a gate resistor $R_G$. Each one of the transistors $Q1_{1-6}$ includes an anti-parallel diode $D1_{1-6}$ coupled between the source contact S and the drain contact D thereof. Although six transistors $Q1_{1-6}$ are shown coupled in parallel with six anti-parallel diodes $D1_{1-6}$, any number of transistors and anti-parallel diodes may be used without departing from the principles of the present disclosure.

Including multiple parallel-coupled transistors $Q1_{1-6}$ and multiple anti-parallel diodes $D1_{1-6}$ allows the first switching module SM1 to handle larger amounts of power than would otherwise be possible. For example, in one embodiment each one of the transistors $Q1_{1-6}$ is rated to block 1.2 kV and conduct 50 A, thereby making the first switching module SM1 capable of conducting 300 A. In other embodiments, each one of the transistors $Q1_{1-6}$ may be rated to block 1.2 kV and conduct 40 A, thereby making the first switching module SM1 capable of conducting 240 A. In yet another embodiment, each one of the transistors $Q1_{1-6}$ may be rated to block 1.2 kV and conduct 20 A, thereby making the first switching module SM1 capable of conducting 120 A.

The gate resistors $R_G$ may be provided to dampen any undesirable oscillations in the first switching module SM1 that may occur when the first switching module SM1 is driven at a relatively high transition speed (e.g., greater than 20 V/ns). The resistance of the gate resistors $R_G$ may vary according to the current rating of each one of the transistors $Q1_{1-6}$, and therefore, the overall current rating of the first switching module SM1. In one embodiment wherein the first switching module SM1 has a current rating of 120 A, each one of the gate resistors $R_G$ has a resistance between about 1Ω and 15Ω. In an additional embodiment wherein the first switching module SM1 has a current rating of 240 A, each one of the gate resistors $R_G$ has a resistance between about 1Ω and 15Ω. In yet another embodiment wherein the first switching module SM1 has a current rating of 300 A, each one of the gate resistors has a resistance between about 15Ω and 20Ω.

Figure 4:
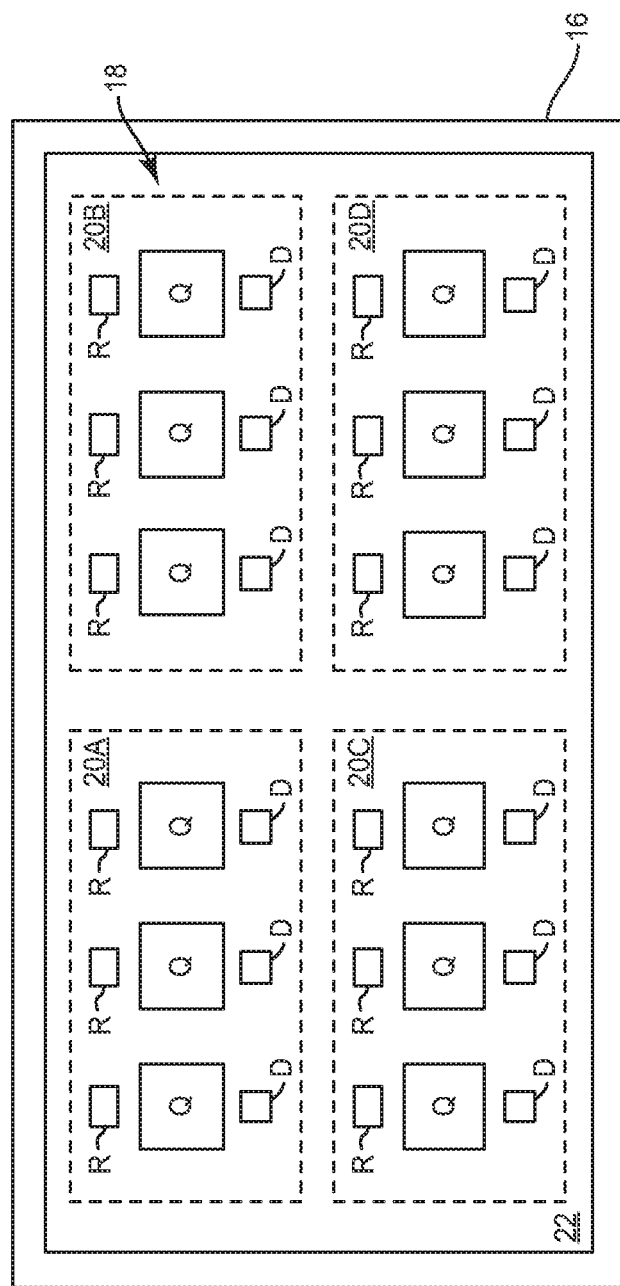
FIG. 4 is a block diagram illustrating details of the power module shown in FIG. 1 according to one embodiment of the present disclosure.

FIG. 4 shows details of the power module 10 according to one embodiment of the present disclosure. As shown in FIG. 4, the power module 10 includes a housing 16 provided with an interior chamber 18 that holds one or more power substrates 20. Specifically, the interior chamber 18 of the housing 16 holds a first power substrate 20A, a second power substrate 20B, a third power substrate 20C, and a fourth power substrate 20D. Those of ordinary skill in the art will appreciate that the interior chamber 18 of the housing 16 can hold any number of power substrates 20 without departing from the principles of the present disclosure. Each one of the power substrates 20 is shown including multiple transistors Q, multiple diodes D, and multiple resistors R, that represent the primary components of the first switching module SM1 and the second switching module SM2. In one embodiment, the first switching module SM1 is provided by the first power substrate 20A and the second power substrate 20B, while the second switching module SM2 is provided by the third power substrate 20C and the fourth power substrate 20D, respectively. The necessary interconnects between the components on each one of the power substrates 20 may be provided by metal traces (not shown) on the surface of the power substrates 20. Further, wire bonds (not shown) may be provided to interconnect the different power substrates 20, as well as to connect the power substrates 20 to one or more external connectors (not shown). The power substrates 20 may be mounted to a mounting structure 22 that is affixed to the housing 16. In one embodiment, the mounting structure 22 is a planar heat sink that also functions to dissipate heat generated by the first switching module SM1 and the second switching module SM2.

As discussed above, the multiple transistors Q and diodes D may be majority carrier devices, thereby decreasing the switching time and losses associated with each one of the transistors Q and diodes D. Accordingly, the power module 10 may operate at higher frequencies, and suffer smaller switching losses than a conventional power module. Further, the transistors Q and diodes D may be wide band-gap devices, such as SiC devices. As discussed above, using SiC for the transistors Q and diodes D significantly reduces the switching time and switching losses of the transistors Q and diodes D, thereby increasing the performance of the power module 10.

Figure 5:
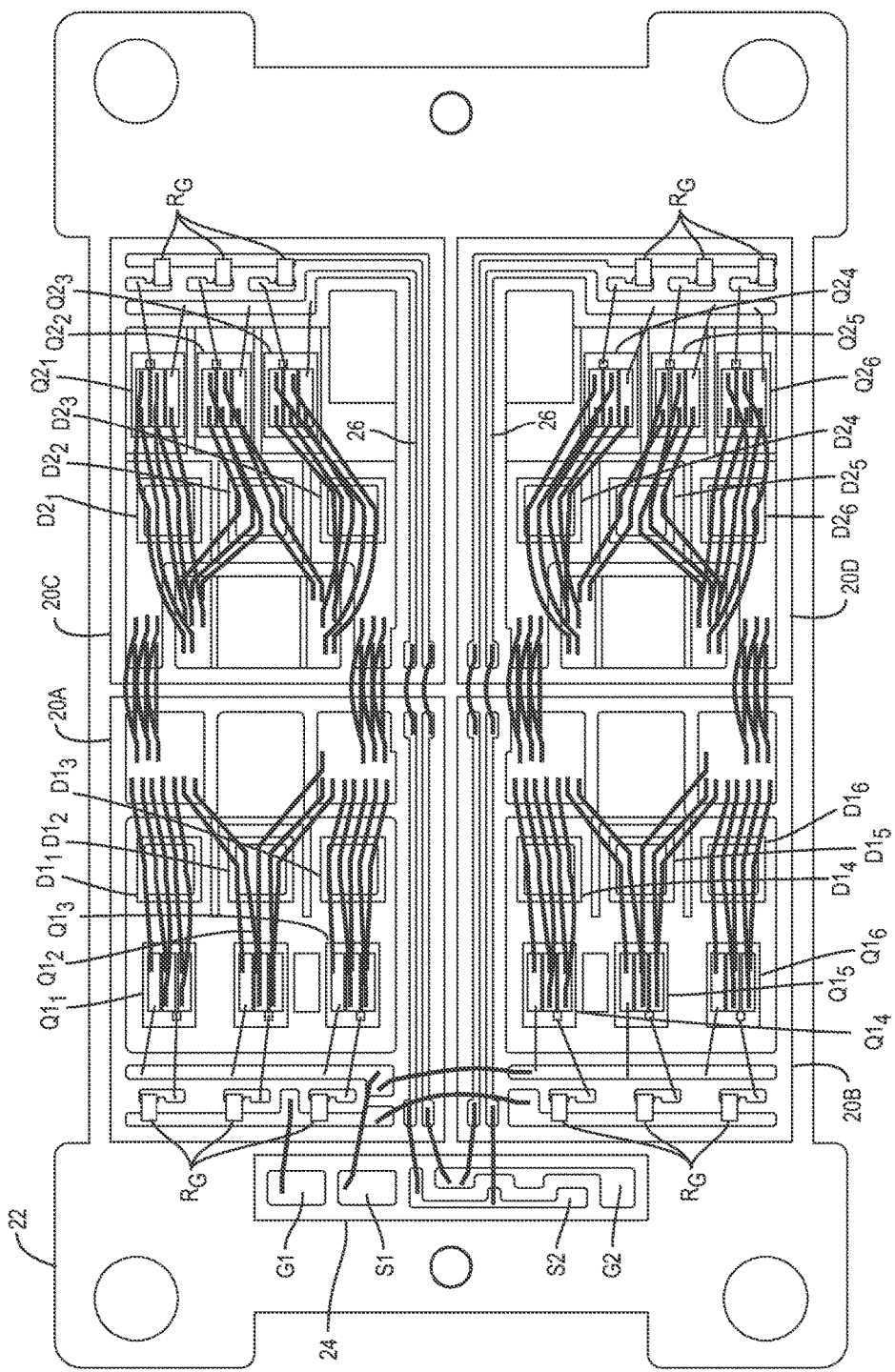
FIG. 5 is a plan-view illustrating details of the power module shown in FIG. 1 according to one embodiment of the present disclosure.

FIG. 5 shows an exemplary mounting structure 22 and details of the power substrates 20 according to one embodiment of the present disclosure. As shown in FIG. 5, the first power substrate 20A, the second power substrate 20B, the third power substrate 20C, and the fourth power substrate 20D are provided on the mounting structure 22. The first power substrate 20A includes three of the six transistors $Q1_{1-3}$, three gate resistors $R_G$, and three of the six anti-parallel diodes $D1_{1-3}$ of the first switching module SM1. The second power substrate 20B includes the remaining transistors $Q1_{4-6}$, gate resistors $R_G$, and anti-parallel diodes $D1_{4-6}$ of the first switching module SM1. Similarly, the third power substrate 20C includes three of the six transistors $Q2_{1-3}$, three gate resistors $R_G$, and three of the six anti-parallel diodes $D2_{1-3}$ of the second switching module SM2. The fourth power substrate 20D includes the remaining transistors $Q2_{4-6}$, gate resistors $R_G$, and anti-parallel diodes $D2_{4-6}$ of the second switching module SM2. The thicker, dark lines represent wire-bonds between the various components in the power module 10 and between the various components and one or more outputs 24 of the power module 10. The outputs 24 of the power module 10 include the first gate connector G1, the second gate connector G2, the first source return connector S1, and the second source return connector S2 discussed above. Other interconnects between the components on the power substrates 20 are provided by metal traces. Notably, a gate bus 26 is provided on the power substrates 20, and runs between the gate contacts G of the transistors $Q2_{1-6}$ in the second switching module SM2 and the outputs 24 of the power module 10. Specifically, the gate bus 26 runs between the gate contacts G of the transistors $Q2_{1-6}$ in the second switching module SM2 and the second gate connector G2, and may further provide a low power path from the source contacts S of the transistors $Q2_{1-6}$ in the second switching module SM2 and the second source return connector S2. The gate bus 26 is a metal trace on each one of the power substrates 20, which reduces interference in the power module 10 and increases the reliability of the connection between the gate contacts G of the transistors $Q2_{1-6}$ in the second switching module SM2 and the outputs 24 of the power module 10, especially when compared to the "flying" gate connections used in conventional power modules. As illustrated, the mounting structure 22 may form all or part of a heat sink that functions to dissipate heat generated by the first switching module SM1 and the second switching module SM2.

In one embodiment, the gate bus 26 may be replaced with one or more coaxial cables to connect the gate contacts G of the transistors $Q2_{1-6}$ in the second switching module and the outputs 24 of the power module 10. Using coaxial cables to connect the outputs to the gate contacts G of the transistors $Q2_{1-6}$ may provide improved isolation when compared to other solutions, thereby improving the performance of the power module 10. Further, although the outputs 24 for the gate contacts G of both the switching module SM1 and the second switching module SM2 are provided on the same side of the housing 16 of the power module 10, in other embodiments they may be provided on opposite sides of the housing 16. Providing the outputs 24 for the gate contacts G of the first switching module SM1 and the second switching module SM2 on opposite sides of the housing 16 may provide a shorter connection route to each one of the gate contacts G of the second switching module SM2, thereby reducing interference and improving the ruggedness of the power module 10. Further, providing the outputs 24 for the gate contacts G of the first switching module SM1 and the second switching module SM2 on opposite sides of the housing 16 may reduce the required resistance of the gate resistor $R_G$ of each one of the transistors $Q2_{1-6}$ in the second switching module SM2, as a shorter connection path between the gate contacts G and the outputs 24 reduces the amount of oscillation seen by the transistors $Q2_{1-6}$.

Figure 6:
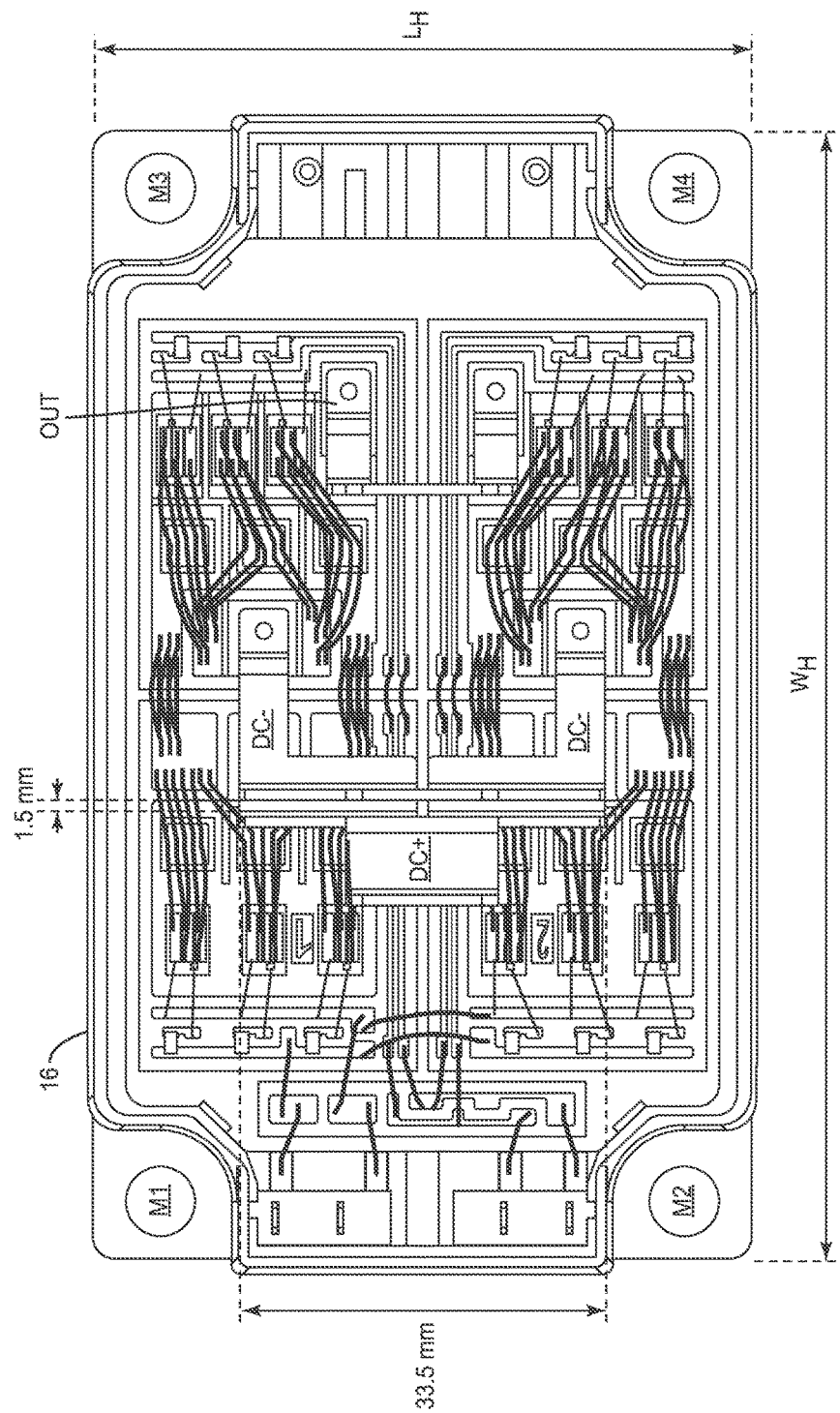
FIG. 6 is a plan-view illustrating further details of the power module shown in FIG. 1 according to one embodiment of the present disclosure.

FIG. 6 shows further details of the housing 16, the output terminal OUT, the positive power supply terminal DC+, and the negative power supply terminal DC− according to one embodiment of the present disclosure. As shown in FIG. 6, the housing 16 is substantially rectangular, including cutaways for mounting holes M1-M4 used to mount the power module 10 to a platform. Further, the positive power supply terminal DC+, the negative power supply terminal DC−, and the output terminal OUT are shown. As will be appreciated by those of ordinary skill in the art, the stray inductance across the positive power supply terminal DC+ and the negative power supply terminal DC− may cause a decrease in the performance of the power module 10, especially at high frequencies of operation of the power module 10. Accordingly, the positive power supply terminal DC+ and the negative power supply terminal DC− are provided in close proximity to one another, generally less than 1.5 mm apart, in order to mitigate the leakage inductance across the terminals. Further, the terminals may be made wide, generally around 33.5 mm across, in order to maximize the area near the opposing terminal. Generally, the positive power supply terminal DC+ and the negative power supply terminal DC− will have an area between about 150 $mm^2$ and 200 $mm^2$ within 1.5 mm of the other. In one embodiment, the positive power supply terminal DC+ and the negative power supply terminal DC− have an area of about 187.31 $mm^2$ within 1.5 mm of the other. As will be appreciated by those of ordinary skill in the art, the capacitive effect generated by placing a relatively large area of the positive power supply terminal DC+ in close proximity to a large area of the negative power supply terminal DC− effectively reduces the leakage inductance between the terminals, thereby improving the performance of the power module 10.

Figure 7:
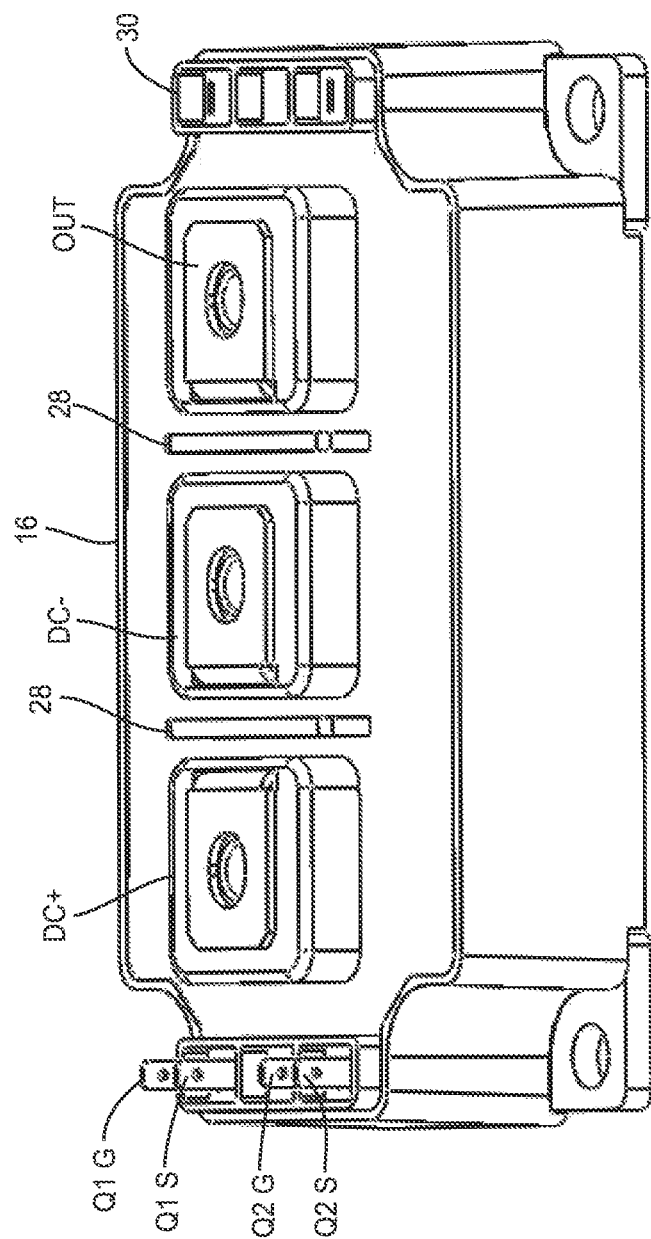
FIG. 7 is a plan-view illustrating an outer housing of the power module shown in FIG. 1 according to one embodiment of the present disclosure.

FIG. 7 shows further details of the housing 16 according to one embodiment of the present disclosure. As shown in FIG. 7, the housing 16 encases the power substrates 20, and provides output terminals for the positive power supply terminal DC+, the negative power supply terminal DC−, the output terminal OUT, and the respective paths to connect the first switching module SM1 and the second switching module SM2 to the control system 12. Notably, the housing 16 and the various output terminals are industry-standard, thereby allowing the power module 10 to be used as a drop-in solution for many pre-existing platforms. Additionally, a creepage divider 28 is provided between each one of the positive power supply terminal DC+, the negative power supply terminal DC−, and the output terminal OUT, which increases the creepage distance between the respective terminals by roughly 50%. Accordingly, the power module 10 may be used in higher voltage applications without the risk of shorting or other damage.

As shown in FIG. 7, one or more unused terminal locations 30 may exist in the housing 16. The unused terminal locations 30 may be used to provide Kelvin connections to one or more components of the power module 10, or may be used to provide connections to NTC temperature sensor modules included in the power module 10 in various embodiments.

Figure 8:
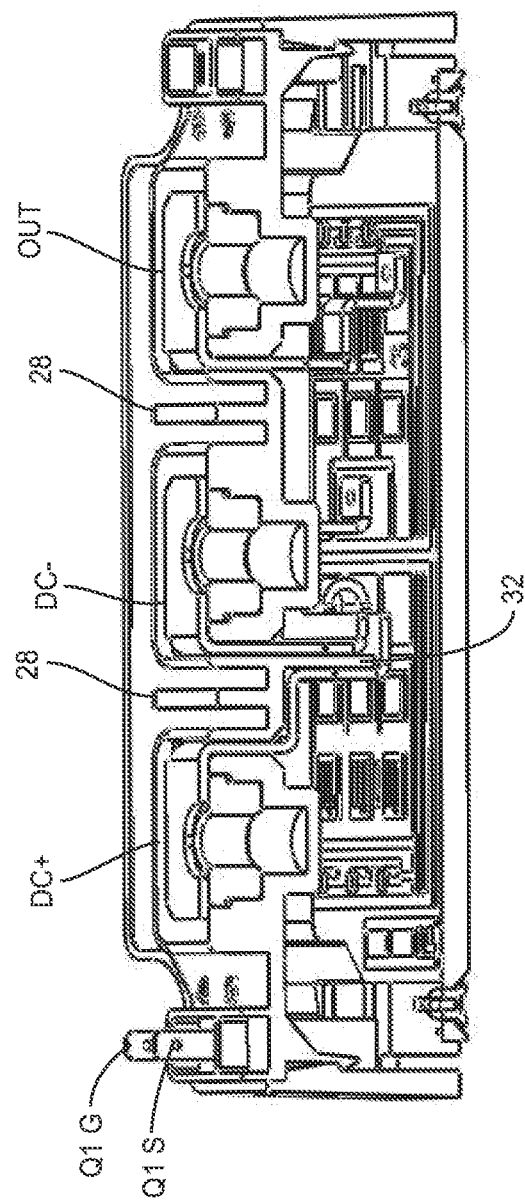
FIG. 8 is a plan-view illustrating details of the outer housing of the power module shown in FIG. 1 according to one embodiment of the present disclosure.

FIG. 8 shows a cutaway view of the power module 10 according to one embodiment of the present disclosure. Notably, an additional creepage divider 32 is provided between the positive power supply terminal DC+ and the negative power supply terminal DC−, which isolates the respective nodes from one another and therefore protects against shorting at high voltages while simultaneously allowing the power module 10 to take advantage of a reduction in the leakage inductance between the nodes discussed above.

Figure 9:
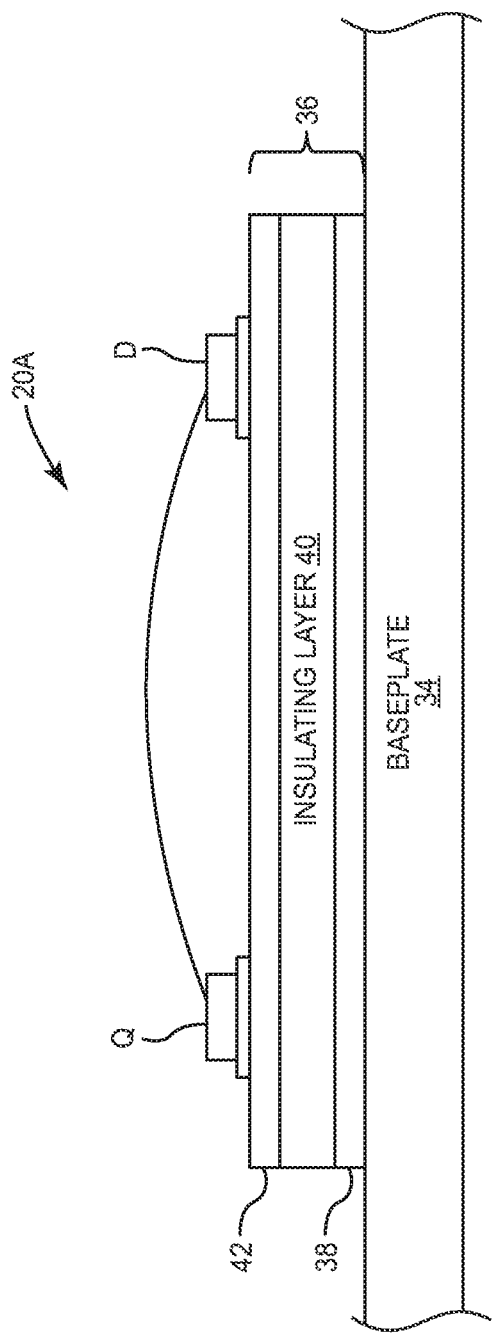
FIG. 9 is a block diagram illustrating details of the power substrates in the power module shown in FIG. 4 according to one embodiment of the present disclosure.

FIG. 9 shows details of the first power substrate 20A according to one embodiment of the present disclosure. The second power substrate 20B, the third power substrate 20C, and the fourth power substrate 20D may be configured similarly to the first power substrate 20A, but are not shown for brevity. As shown in FIG. 9, the first power substrate 20A is formed on a baseplate 34, which may be copper. Those of ordinary skill in the art will appreciate that many different materials exist for the baseplate 34, all of which are contemplated herein. In one embodiment, the baseplate 34 is aluminum silicon carbide (AlSiC), which may be lighter weight and offer better thermal matching with one or more attached components than copper. The baseplate 34 may be shared between each one of the power substrates 20, such that the first power substrate 20A, the second power substrate 20B, the third power substrate 20C, and the fourth power substrate 20D are all formed on the baseplate 34. A direct-bonded-copper (DBC) substrate 36 may be provided over the baseplate 34. The DBC substrate 36 may include a first metal layer 38 on the surface of the baseplate 34, an insulating layer 40 over the first metal layer 38, and a second metal layer 42 over the insulating layer 40 opposite the first metal layer 38. The first metal layer 38 and the second metal layer 42 may be, for example, copper. Those of ordinary skill in the art will appreciate that many different suitable materials for the first metal layer 38 and the second metal layer 42 exist, all of which are contemplated herein. The insulating layer 40 may be, for example, aluminum nitride (AlN). Those of ordinary skill in the art will appreciate that many different suitable materials for the insulating layer 40 exist, for example, aluminum oxide ($Al_2O_3$) or silicon nitride ($Si_3N_4$), all of which are contemplated herein.

Using AlN for the insulating layer 40 may provide much higher thermal conductivity when compared to conventional alumina or silicon nitride (SiN) layers. Given the relatively low electrical resistance associated with SiC devices and the low thermal resistance of AlN, the power module 10 can thus handle higher currents than conventional power modules. The thickness of the insulating layer 40 may be selected based on the targeted isolation voltage. Due to the advantages provided by the use of SiC components and the AlN insulating layer 40, the power module 10 is capable of handling greater power than a conventional device of the same size, and/or may be reduced to a smaller size than its conventional counterpart.

Those skilled in the art will recognize improvements and modifications to the preferred embodiments of the present disclosure. All such improvements and modifications are considered within the scope of the concepts disclosed herein and the claims that follow.

What is claimed is:
1. A power module comprising:
   a housing with an interior chamber; and
   a plurality of switch modules mounted within the interior chamber and interconnected to facilitate switching power to a load wherein each of the plurality of switch modules comprises at least one transistor and at least one diode and the power module is able to block at least 1200 volts, conduct at least 120 amperes, and has switching losses less than 25 milli-Joules.
2. The power module of claim 1 wherein the power module has switching losses between 1 milli-Joules and 25 milli-Joules.

3. The power module of claim 1 wherein the power module has switching losses between 1 milli-Joules and 20 milli-Joules.

4. The power module of claim 1 wherein the power module has switching losses between 1 milli-Joules and 15 milli-Joules.

5. The power module of claim 1 wherein the at least one transistor and the at least one diode are silicon carbide (SiC) devices.

6. The power module of claim 5 wherein the at least one transistor is a metal-oxide-semiconductor field-effect transistor (MOSFET) and the at least one diode is a Schottky diode.

7. The power module of claim 6 wherein the at least one transistor is coupled in anti-parallel with the at least one diode.

8. The power module of claim 7 wherein the at least one transistor comprises an array of transistors coupled in parallel and the at least one diode comprises an array of diodes coupled in parallel.

9. The power module of claim 1 wherein the power module is configured to operate at a switching frequency of at least 50 kHz.

10. A power module comprising:
a housing with an interior chamber;
at least a first power substrate within the interior chamber, the first power substrate including one or more switch modules on a first surface of the first power substrate for facilitating switching power to a load, wherein each of the one or more switch modules comprise at least one transistor and at least one diode; and
a gate connector coupled to a gate contact of the at least one transistor of each of the one or more switch modules via a signal path that includes a shielded cable.

11. The power module of claim 10 wherein the shielded cable is a coaxial cable.

12. The power module of claim 10 wherein the power module is able to block at least 1200 volts, conduct at least 120 amperes, and has switching losses less than 25 milli-Joules.

13. The power module of claim 10 wherein the at least one transistor and the at least one diode are silicon carbide (SiC) devices.

14. The power module of claim 10 wherein the power module is configured to operate at a switching frequency of at least 50 kHz.

15. A power module comprising:
a housing with an interior chamber;
a plurality of switch modules mounted within the interior chamber and interconnected to facilitate switching power to a load wherein each of the plurality of switch modules comprises at least one transistor configured to conduct current in a first direction via a channel in the at least one transistor and conduct current in a second direction opposite the first direction via an internal body diode in the at least one transistor.

16. The power module of claim 15 wherein the power module is able to block at least 1200 volts, conduct at least 120 amperes, and has switching losses less than 25 milli-Joules.

17. The power module of claim 15 wherein the at least one transistor is a metal-oxide-semiconductor field-effect transistor (MOSFET).

18. The power module of claim 15 wherein the at least one transistor is a silicon carbide (SiC) device.

19. The power module of claim 15 wherein the at least one transistor comprises an array of transistors coupled in parallel.

20. The power module of claim 15 wherein the power module is configured to operate at a switching frequency of at least 50 kHz.

* * * * *